US012720887B2

(12) United States Patent
Ryu et al.

(10) Patent No.: US 12,720,887 B2
(45) Date of Patent: Aug. 25, 2026

(54) IMAGE SENSOR AND METHOD OF FABRICATING THE SAME

(71) Applicant: SAMSUNG ELECTRONICS CO., LTD., Suwon-si (KR)

(72) Inventors: Je-Hyung Ryu, Suwon-si (KR); Hajin Lim, Suwon-si (KR); Jongmin Jeon, Suwon-si (KR); Taeksoo Jeon, Suwon-si (KR); Jaesung Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 385 days.

(21) Appl. No.: 18/381,800

(22) Filed: Oct. 19, 2023

(65) Prior Publication Data

US 2024/0234458 A1 Jul. 11, 2024

(30) Foreign Application Priority Data

Jan. 9, 2023 (KR) ........................ 10-2023-0003081

(51) Int. Cl.
*H10F 39/00* (2025.01)

(52) U.S. Cl.
CPC ..... *H10F 39/8057* (2025.01); *H10F 39/8053* (2025.01); *H10F 39/8063* (2025.01); *H10F 39/807* (2025.01)

(58) Field of Classification Search
CPC ............ H10F 39/8057; H10F 39/8053; H10F 39/8063; H10F 39/807; H10F 39/024; H10F 39/199; H10F 39/011; H10F 39/811; H10F 39/805; H10F 39/802
See application file for complete search history.

(56) References Cited

U.S. PATENT DOCUMENTS

| | | | | |
|---|---|---|---|---|
| 8,471,348 | B2 | 6/2013 | Ohba et al. | |
| 9,437,645 | B1 | 9/2016 | Chou et al. | |
| 10,529,760 | B2 | 1/2020 | Hiyama et al. | |
| 11,183,525 | B2 | 11/2021 | Lim | |
| 11,302,733 | B2 | 4/2022 | Jang et al. | |
| 2013/0264469 | A1* | 10/2013 | Kikuchi | H10F 71/00 438/57 |
| 2014/0065756 | A1* | 3/2014 | Hsu | H10F 39/8063 438/65 |
| 2016/0276394 | A1* | 9/2016 | Chou | H10F 39/811 |
| 2018/0040656 | A1* | 2/2018 | Jang | H10F 39/807 |
| 2018/0076247 | A1 | 3/2018 | Pang et al. | |
| 2018/0301491 | A1* | 10/2018 | Nakamoto | H10F 39/807 |
| 2020/0119072 | A1* | 4/2020 | Lim | H10F 39/8057 |

(Continued)

FOREIGN PATENT DOCUMENTS

| | | |
|---|---|---|
| KR | 10-2021-0048059 A | 5/2021 |
| KR | 10-2022-0087227 A | 6/2022 |

(Continued)

*Primary Examiner* — Bitew A Dinke
(74) *Attorney, Agent, or Firm* — Sughrue Mion, PLLC

(57) ABSTRACT

Image sensors and fabrication methods thereof are provided. An image sensor includes a semiconductor substrate including pixel regions, and a fence structure that defines openings that correspond to the pixel regions. A fence structure includes a metal pattern on the semiconductor substrate, a low-refractive pattern on the metal pattern, and a metal oxide pattern between the metal pattern and the low-refractive pattern.

20 Claims, 26 Drawing Sheets

(56) References Cited

U.S. PATENT DOCUMENTS

2020/0403025 A1* 12/2020 Kim .................... H10F 39/802
2021/0066374 A1 3/2021 Kim
2021/0126028 A1* 4/2021 Jeon .................... H10F 39/803
2021/0193720 A1 6/2021 Seo et al.
2021/0335877 A1* 10/2021 Kim .................... H10F 39/8037
2021/0366969 A1* 11/2021 Bak .................... H10F 39/8063
2022/0037385 A1* 2/2022 Bang .................... H10F 39/8057
2022/0093657 A1* 3/2022 Jo .................... H10F 39/811
2022/0149100 A1 5/2022 Ikeda et al.
2022/0173146 A1* 6/2022 Chung .................... H10F 39/8057
2022/0231065 A1* 7/2022 Chou .................... H10F 39/8057
2022/0238583 A1* 7/2022 Chang .................... H10F 39/8063
2022/0285416 A1* 9/2022 Hsieh .................... H10F 39/8057
2022/0293651 A1* 9/2022 Chen .................... H10F 39/182
2022/0359586 A1* 11/2022 Kim .................... H10F 39/807
2022/0359598 A1 11/2022 Lin et al.
2023/0326942 A1* 10/2023 Wang .................... H10F 39/807

FOREIGN PATENT DOCUMENTS

TW I563643 B 12/2016
TW I686939 B 3/2020

* cited by examiner

FIG. 3

PR
PR
PR
PR
PR
PR
PR
PR
I
I'
P1
P2
PIS(320)
D1
D2
D3

FIG. 4

210
100a
115
113
111
100
100b
PIS
I
I'
FD
PD
TG
105
223
221
PR
PR
PR
PR
PD
PD
PD

IMAGE SENSOR AND METHOD OF FABRICATING THE SAME

CROSS-REFERENCE TO RELATED APPLICATION

This U.S. nonprovisional application claims priority under 35 U.S.C. § 119 to Korean Patent Application No. 10-2023-0003081, filed on Jan. 9, 2023, in the Korean Intellectual Property Office, the disclosure of which is hereby incorporated by reference herein in its entirety.

BACKGROUND

The present disclosure relates generally to an image sensor and a method of fabricating the same, and more particularly, to an image sensor with improved electrical and optical properties and a method of fabricating the same.

An image sensor converts photonic images into electrical signals. Recent advances in computer and communication industries have led to strong demands in high performances image sensors in various consumer electronic devices such as digital cameras, camcorders, PCSs (personal communication systems), game consoles, security cameras, and medical micro-cameras.

An image sensor may be classified into being a charged coupled device (CCD) and a CMOS image sensor. The CMOS image sensor has a simple operating method, and a size of its product is possibly minimized because its signal processing circuit is integrated into a single chip. Also, the CMOS image sensor requires relatively small power consumption, which is useful in battery-powered application. In addition, because process technology of manufacturing CMOS image sensors is compatible with CMOS process technology, the CMOS image sensors can decrease in fabrication cost. Accordingly, the use of the CMOS image sensor has been rapidly increasing as a result of advanced in technology and implementation of high resolution.

SUMMARY

One or more example embodiments provide an image sensor with increased electrical and optical properties and a method of fabricating the same.

According to an aspect of an example embodiment, an image sensor includes a semiconductor substrate including pixel regions; and a fence structure that defines openings corresponding to the pixel regions, wherein the fence structure includes a metal pattern on the semiconductor substrate: a low-refractive pattern on the metal pattern: and a metal oxide pattern between the metal pattern and the low-refractive pattern.

According to an aspect of an example embodiment, an image sensor includes a semiconductor substrate including pixel regions; and a fence structure that defines openings that correspond to the pixel regions, wherein the fence structure includes: a barrier pattern on the semiconductor substrate; and a low-refractive pattern on the barrier pattern, wherein the barrier pattern includes metal and oxygen, the barrier pattern includes: a lower portion adjacent to the semiconductor substrate; and an upper portion adjacent to the low-refractive pattern, and an oxygen concentration of the upper portion is greater than an oxygen concentration of the lower portion.

According to an aspect of an example embodiment, an image sensor includes: a semiconductor substrate including: a first surface; a second surface opposite to the first surface; a light-receiving area: and a light-shielding area: a pixel isolation structure in the semiconductor substrate on the light-receiving area and the light-shielding area, wherein the pixel isolation structure defines a plurality of pixel regions: a plurality of photoelectric conversion regions in the semiconductor substrate of the plurality of pixel regions on the light-receiving area and the light-shielding area: a plurality of microlenses on the second surface of the semiconductor substrate, each of the plurality of microlenses being provided on a corresponding one of the plurality of pixel regions: a plurality of color filters between the microlenses and the second surface of the semiconductor substrate, wherein each of the color filters is provided on a corresponding one of the plurality of pixel regions: an antireflection layer between the color filters and the second surface of the semiconductor substrate; and a fence structure on the antireflection layer and between neighboring ones of the color filters, wherein the fence structure includes: a barrier pattern on the antireflection layer; and a low-refractive pattern on the barrier pattern, and wherein the barrier pattern includes: a metal pattern on the antireflection layer: and a metal oxide pattern between the metal pattern and the low-refractive pattern.

According to an aspect of an example embodiment, a method of fabricating an image sensor, includes: forming a semiconductor substrate including pixel regions: forming an antireflection layer on the semiconductor substrate: forming a barrier layer on the antireflection layer: forming a low-refractive layer on the barrier layer: patterning the low-refractive layer and the barrier layer to form a fence structure that exposes the antireflection layer, wherein the fence structure defines openings that correspond to the pixel regions; and forming color filters in the openings, wherein the forming the barrier layer includes sequentially forming a metal layer and a metal oxide layer on the antireflection layer.

BRIEF DESCRIPTION OF THE DRAWINGS

The above and other aspects and features will be more apparent from the following description of one or more example embodiments taken in conjunction with the accompanying drawings, in which:

FIG. 3 illustrates a plan view showing an image sensor according to one or more example embodiments:

FIG. 4 illustrates a cross-sectional view taken along line I-I' of FIG. 3, showing an image sensor according to one or more example embodiments:

DETAILED DESCRIPTION

Figure 1:
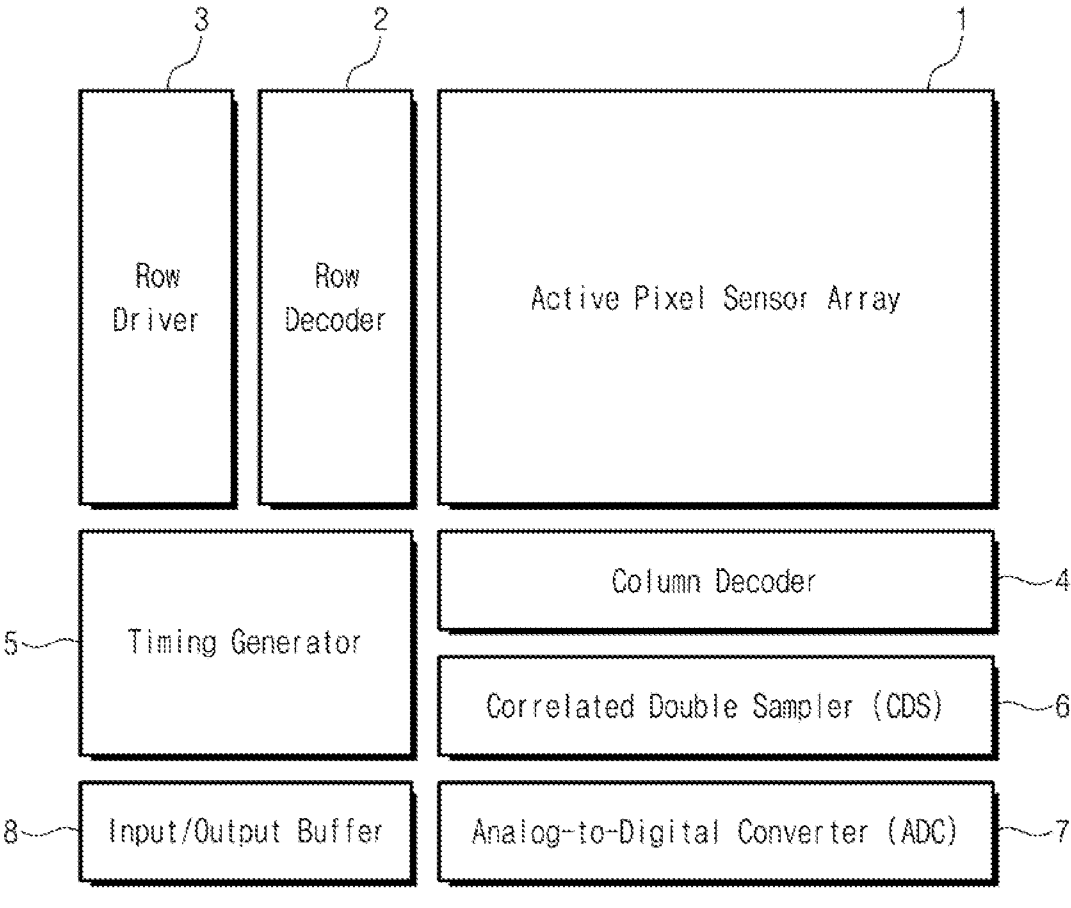
FIG. 1 illustrates a schematic block diagram showing an image sensor according to one or more example embodiments.

Hereinafter, one or more example embodiments will be described in detail with reference to the accompanying drawings. The same reference numerals are used for the same components in the drawings, and duplicate descriptions thereof are omitted.

FIG. 1 illustrates a schematic block diagram showing an image sensor according to one or more example embodiments.

Referring to one or more example embodiments shown in FIG. 1, an image sensor may include an active pixel sensor array (APS) 1, a row decoder 2, a row driver 3, a column decoder 4, a timing generator 5, a correlated double sampler (CDS) 6, an analog-to-digital converter (ADC) 7, and an input/output buffer 8.

The active pixel sensor array 1 may include a plurality of two-dimensionally arranged unit pixels, each of which is configured to convert optical signals into electrical signals. The active pixel sensor array 1 may be driven by a plurality of driving signals such as a pixel selection signal, a reset signal, and a charge transfer signal from the row driver 3. In addition, the converted electrical signals may be provided for the correlated double sampler 6.

The row driver 3 may provide the active pixel sensor array 1 with several driving signals for driving several unit pixels in accordance with a decoded result obtained from the row decoder 2. When the unit pixels are arranged in a matrix shape, the driving signals may be provided for respective rows.

The timing generator 5 may provide the row and column decoders 2 and 4 with timing and control signals.

The correlated double sampler 6 may receive the electrical signals generated in the active pixel sensor array 1, and may hold and sample the received electrical signals. The correlated double sampler 6 may perform a double sampling operation to sample a specific noise level and a signal level of the electrical signal, and then may output a difference level corresponding to a difference between the noise and signal levels.

The analog-to-digital converter 7 may convert analog signals, which correspond to the difference level received from the correlated double sampler 6, into digital signals, and then may output the converted digital signals.

The input/output buffer 8 may latch the digital signals and then may sequentially output the latched digital signals to an image signal processor in response to the decoded result obtained from the column decoder 4.

Figure 2A:
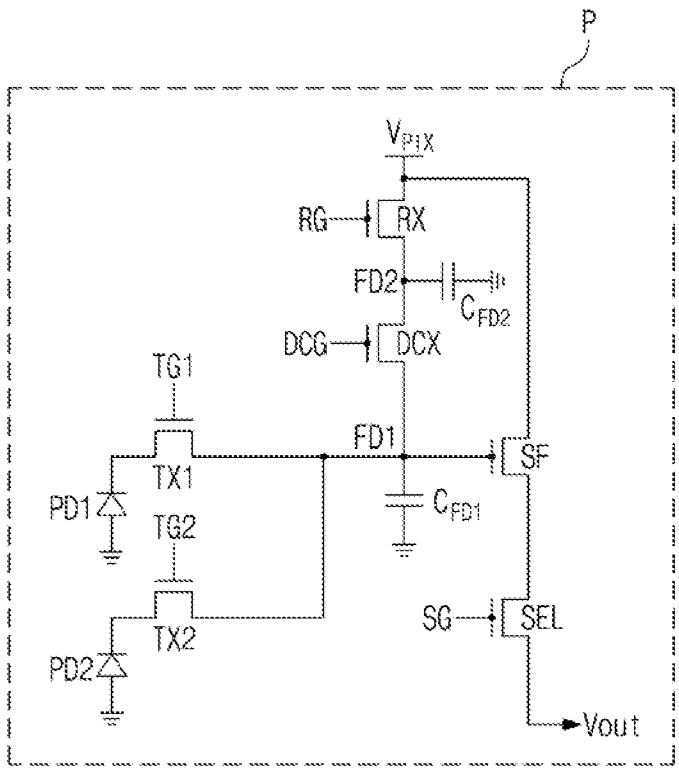
FIGS. 2A and 2B illustrate circuit diagrams showing a unit pixel of an image sensor according to one or more example embodiments.
Figure 2B:
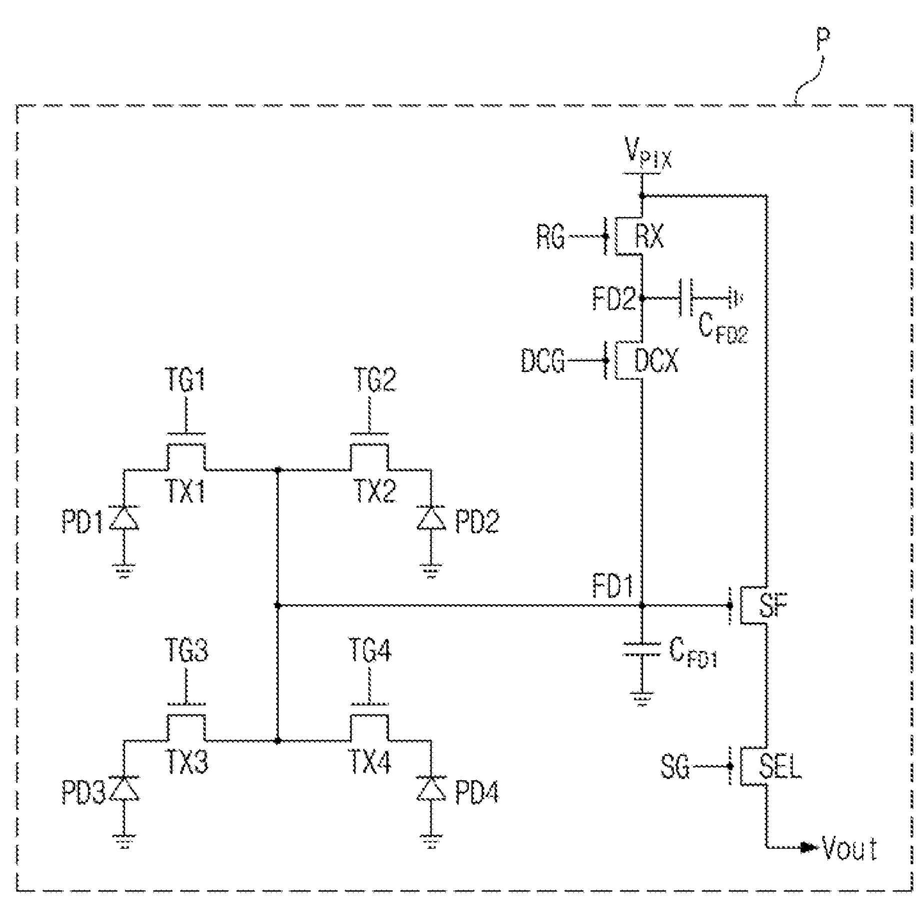

FIGS. 2A and 2B illustrate circuit diagrams showing a unit pixel of an image sensor according to one or more example embodiments.

Referring to one or more example embodiments shown in FIG. 2A, according to one or more example embodiments, a unit pixel P may include a plurality of photoelectric conversion elements PD1 and PD2, a plurality of transfer transistors TX1 and TX2, a floating diffusion region FD, and a plurality of pixel transistors.

For example, the unit pixel P may include first and second photoelectric conversion elements PD1 and PD2, first and second transfer transistors TX1 and TX2, and a first floating diffusion region FD1 connected in common to the first and second transfer transistors TX1 and TX2.

The pixel transistors may include, but are not limited to, a reset transistor RX, a source follower transistor SF, a selection transistor SEL, and a dual conversion gain transistor DCX. In one or more example embodiments, although the unit pixel P is disclosed to include four pixel transistors, one or more example embodiments are not limited thereto, and no limitation is imposed on the number of the pixel transistors in each unit pixel P.

For example, the first and second photoelectric conversion elements PD1 and PD2 may generate and accumulate charges in proportion to an amount of externally incident light. The first and second photoelectric conversion elements PD1 and PD2 may each be one of a photo diode, a photo transistor, a photo gate, a pinned photo diode (PPD), and any combination thereof.

The first and second transfer transistors TX1 and TX2 may provide the first floating diffusion region FD1 with the charges accumulated in the first and second photoelectric conversion elements PD1 and PD2. The first and second transfer transistors TX1 and TX2 may be controlled with first and second transfer signals TG1 and TG2. The first and second transfer transistors TX1 and TX2 may share the first floating diffusion region FD1.

The first floating diffusion region FD1 may receive and accumulate charges generated from the first photoelectric conversion element PD1 or the second photoelectric conversion element PD2. The source follower transistor SF may be controlled in accordance with an amount of photocharges accumulated in the first floating diffusion region FD1.

In response to a reset signal applied to a reset gate electrode RG, the reset transistor RX may periodically reset the charges accumulated in the first floating diffusion region FD1. For example, the reset transistor RX may have a drain terminal connected to the dual conversion gain transistor DCX, and may also have a source terminal connected to a pixel power voltage Vpix. When the reset transistor RX and the double conversion gain transistor DCX are turned on, the pixel power voltage Vpix may be delivered to the first and second floating diffusion regions FD1 and FD2. Therefore, charges accumulated in the first and second floating diffusion regions FD1 and FD2 may be exhausted to reset the first and second floating diffusion regions FD1 and FD2.

The double conversion gain transistor DCX may be connected between the first floating diffusion region FD1 and the second floating diffusion region FD2. The double conversion gain transistor DCX may be connected in series to the reset transistor RX through the second floating diffusion region FD2. For example, the double conversion gain transistor DCX may be connected between the first floating diffusion region FD1 and the reset transistor RX. In response to a double conversion gain signal, the double conversion gain transistor DCX may change capacitance $C_{FD1}$ of the first floating diffusion region FD1, thereby changing a conversion gain of the unit pixel P.

For example, when an image is captured, a pixel array may simultaneously receive light with low illumination and light with high illumination, or may receive light with high intensity and light with low intensity. Therefore, a conversion gain of each pixel may be variable in accordance with incident light. For example, when the double conversion gain transistor DCX is turned off, the unit pixel P may have a first conversion gain, and when the double conversion gain transistor DCX is turned on, the unit pixel P may have a second conversion gain greater than the first conversion gain. Thus, according to an operation of the double conversion gain transistor DCX, different conversion gains may be provided in a first conversion gain mode (or high illumination mode) and a second conversion gain mode (or low illumination mode).

When the double conversion gain transistor DCX is turned off, a capacitance of the first floating diffusion region FD1 may correspond to the first capacitance $C_{FD1}$. When the double conversion gain transistor DCX is turned on, the first floating diffusion region FD1 and the second floating diffusion region FD2 may be connected and, thus, a capacitance of the first and second floating diffusion regions FD1 and FD2 may correspond to a sum of first and second capacitances $C_{FD1}$ and $C_{FD2}$. For example, when the double conversion gain transistor DCX is turned on, a capacitance of the first floating diffusion region FD1 or the second floating diffusion region FD2 may increase to reduce a conversion gain, and when the double conversion gain transistor DCX is turned off, a capacitance of the first floating diffusion region FD1 may decrease to increase a conversion gain.

The source follower transistor SF may be a source follower buffer amplifier that generates a source-drain current in proportion to an amount of charge applied to a source follower gate electrode from the first floating diffusion region FD1. The source follower transistor SF may amplify a variation in electrical potential of the first floating diffusion region FD1 and may output the amplified signal to an output line Vout through the selection transistor SEL. The source follower transistor SF may have a source terminal connected to a power voltage and a drain terminal connected to a source terminal of the selection transistor SEL.

The selection transistor SEL may select each row of the unit pixel P to be readout. When the selection transistor SEL is turned on in response to a selection signal applied to a selection gate electrode SG, the output line Vout may output an electrical signal that is output from the drain terminal of the source follower transistor SF.

Referring to one or more example embodiments shown in FIG. 2B, according to one or more example embodiments, the unit pixel P may include first, second, third, and fourth photoelectric conversion elements PD1, PD2, PD3, and PD4, first, second, third, and fourth transfer transistors TX1, TX2, TX3, and TX4, and a first floating diffusion region FD1. Likewise, according to one or more example embodiments of FIG. 2A, the unit pixel P may include four pixel transistors RX, DCX, SF, and SEL.

The first, second, third, and fourth transfer transistors TX1, TX2, TX3, and TX4 may share the first floating diffusion region FD1. The first, second, third, and fourth transfer transistors TX1, TX2, TX3, and TX4 may have transfer gate electrodes correspondingly controlled with first, second, third, and fourth transfer signals TG1, TG2, TG3, and TG4.

Figure 3:
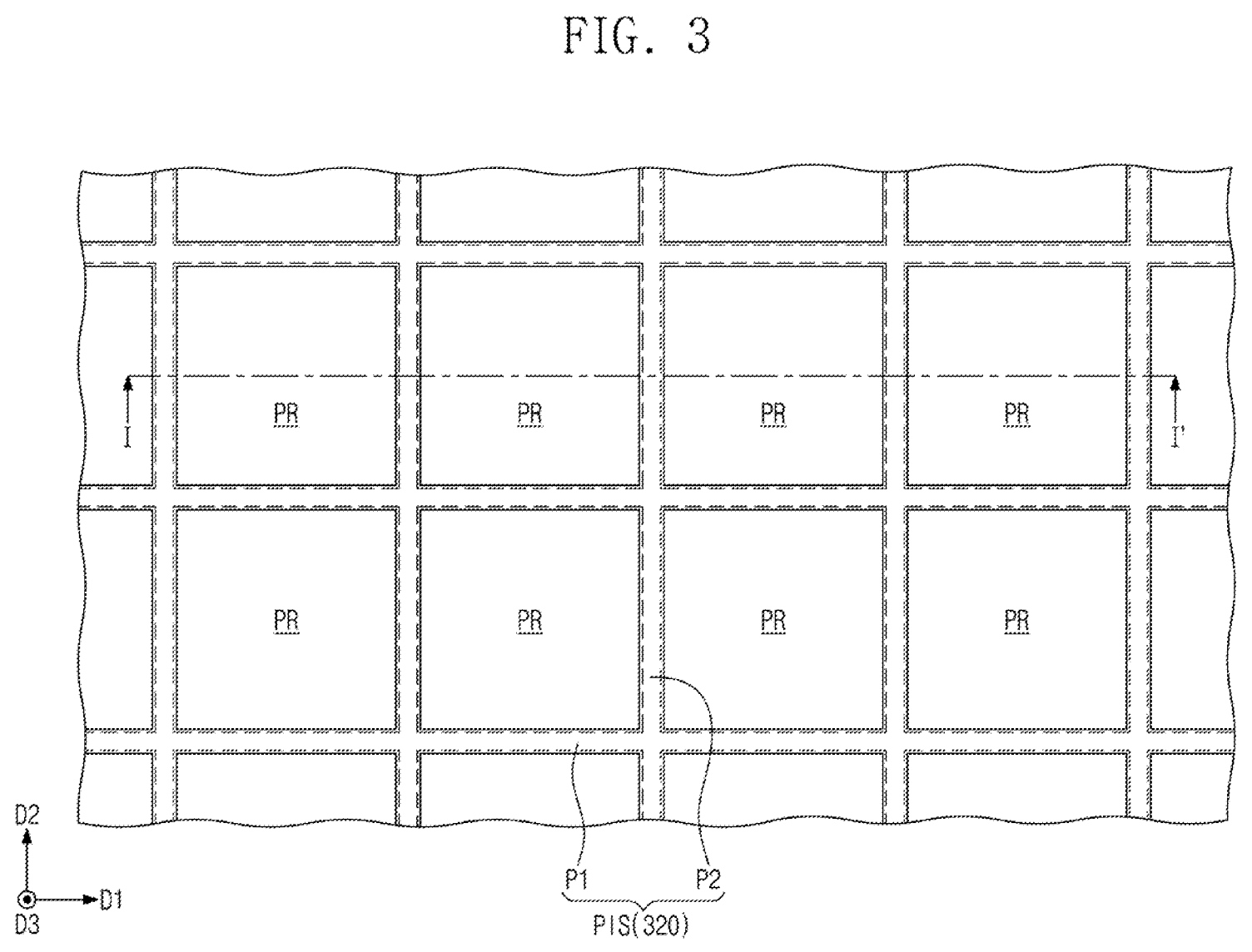
Figure 4:
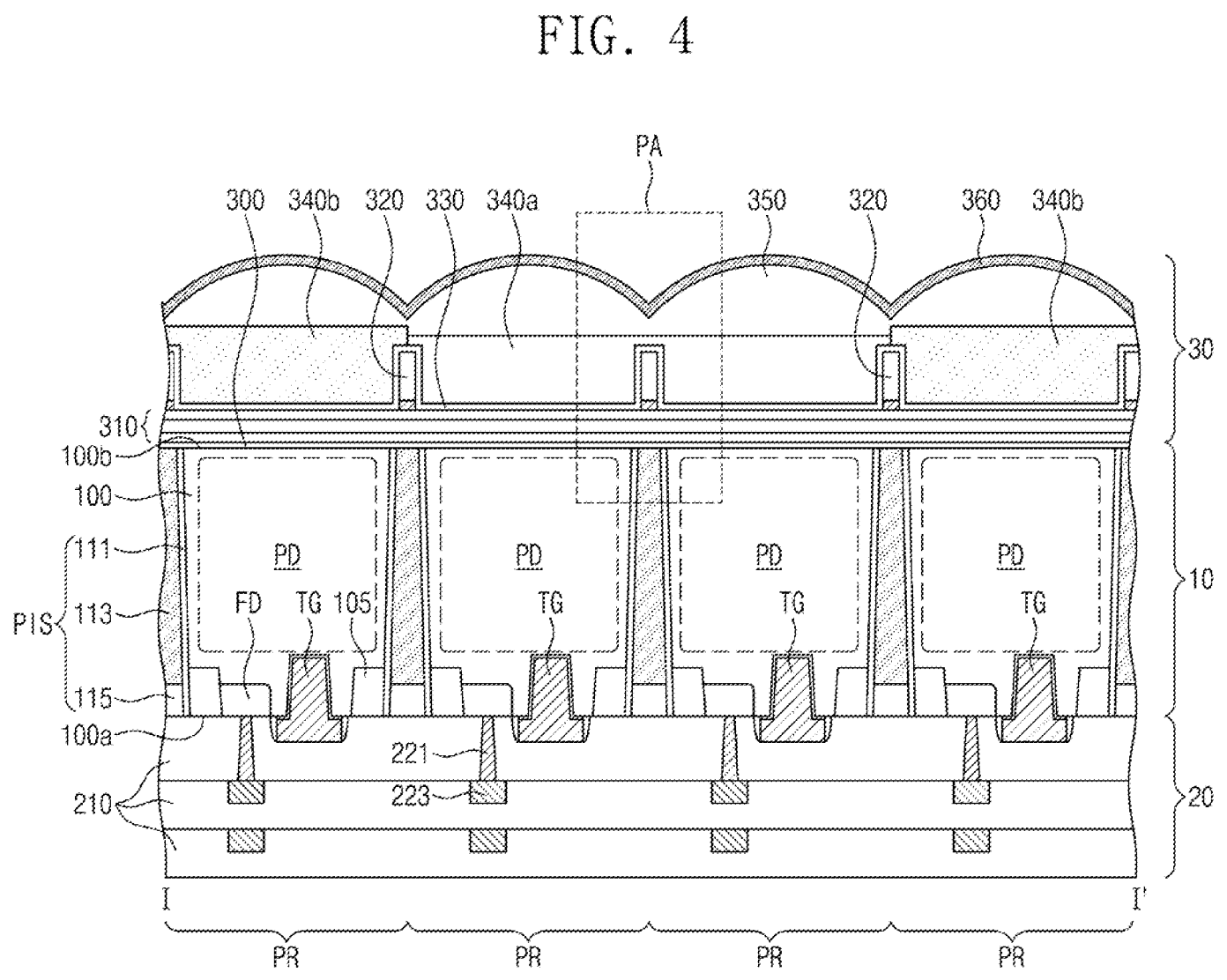
Figure 5A:
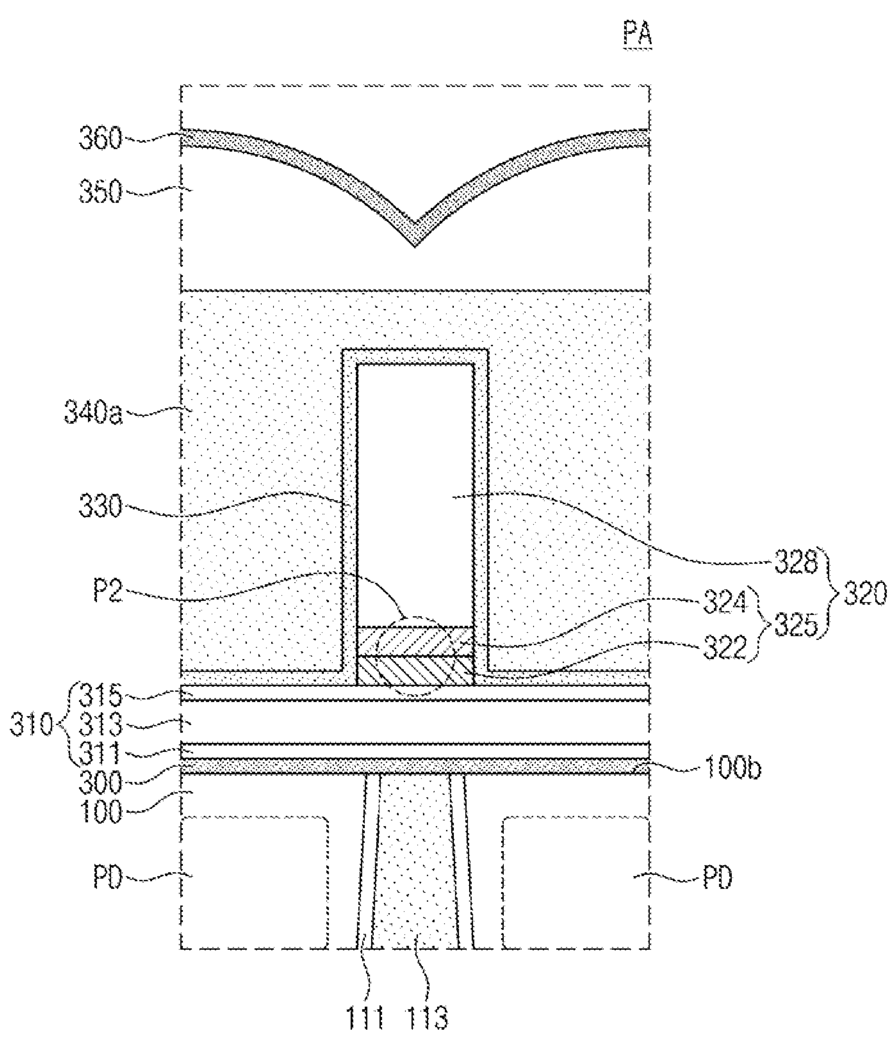
FIG. 5A illustrates an enlarged view showing section PA of FIG. 4 according to one or more example embodiments.
Figure 5B:
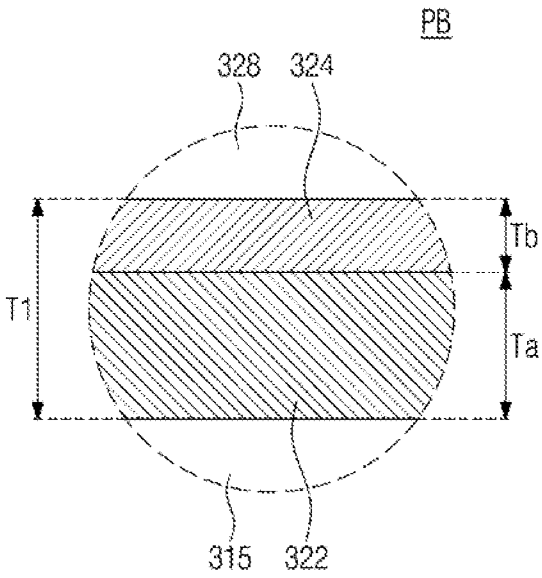
FIGS. 5B and 5C illustrate enlarged views showing section PB of FIG. 5A4 according to one or more example embodiments.
Figure 5C:
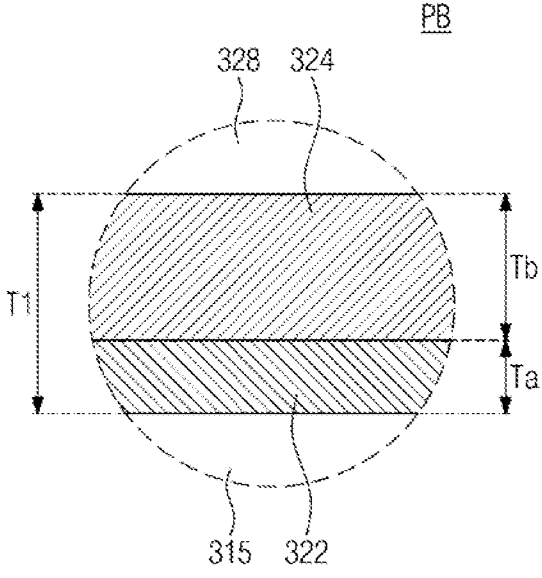
Figure 6A:
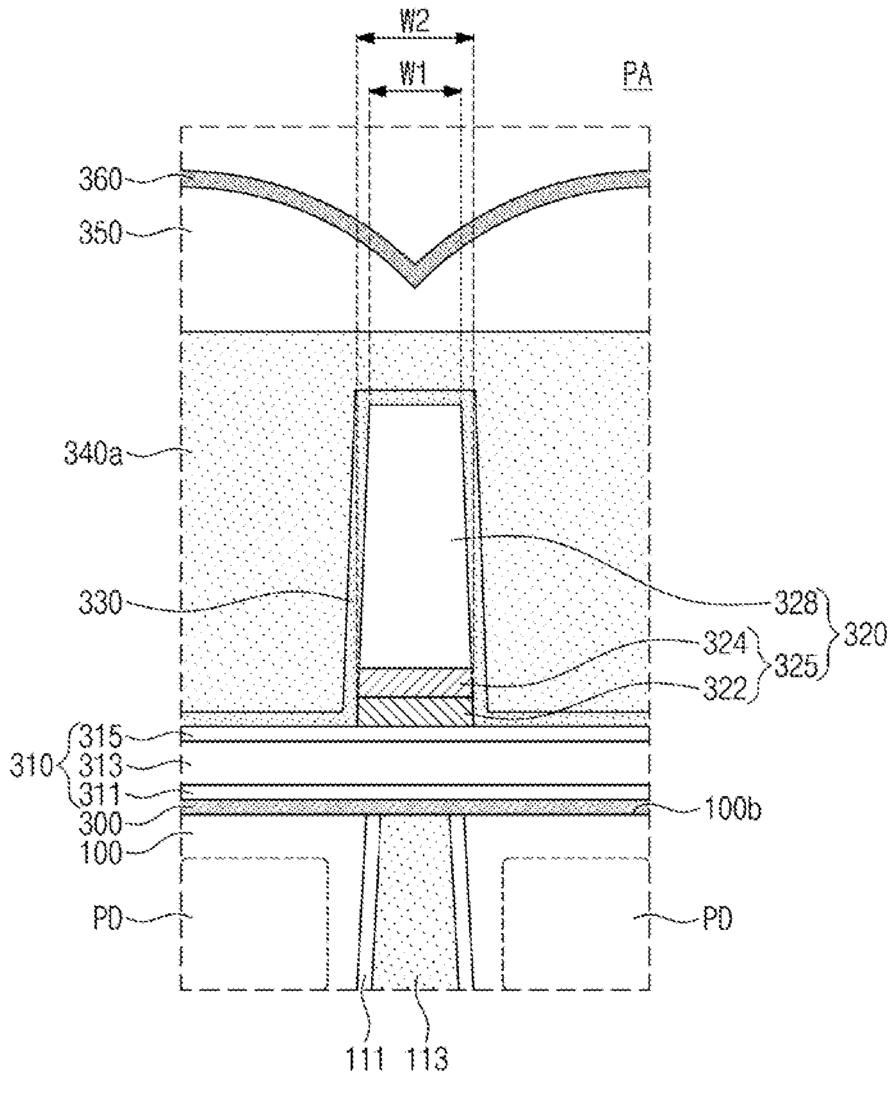
FIGS. 6A, 6B, and 6C illustrate enlarged views of section PA of FIG. 4, partially showing an image sensor according to one or more example embodiments.
Figure 6B:
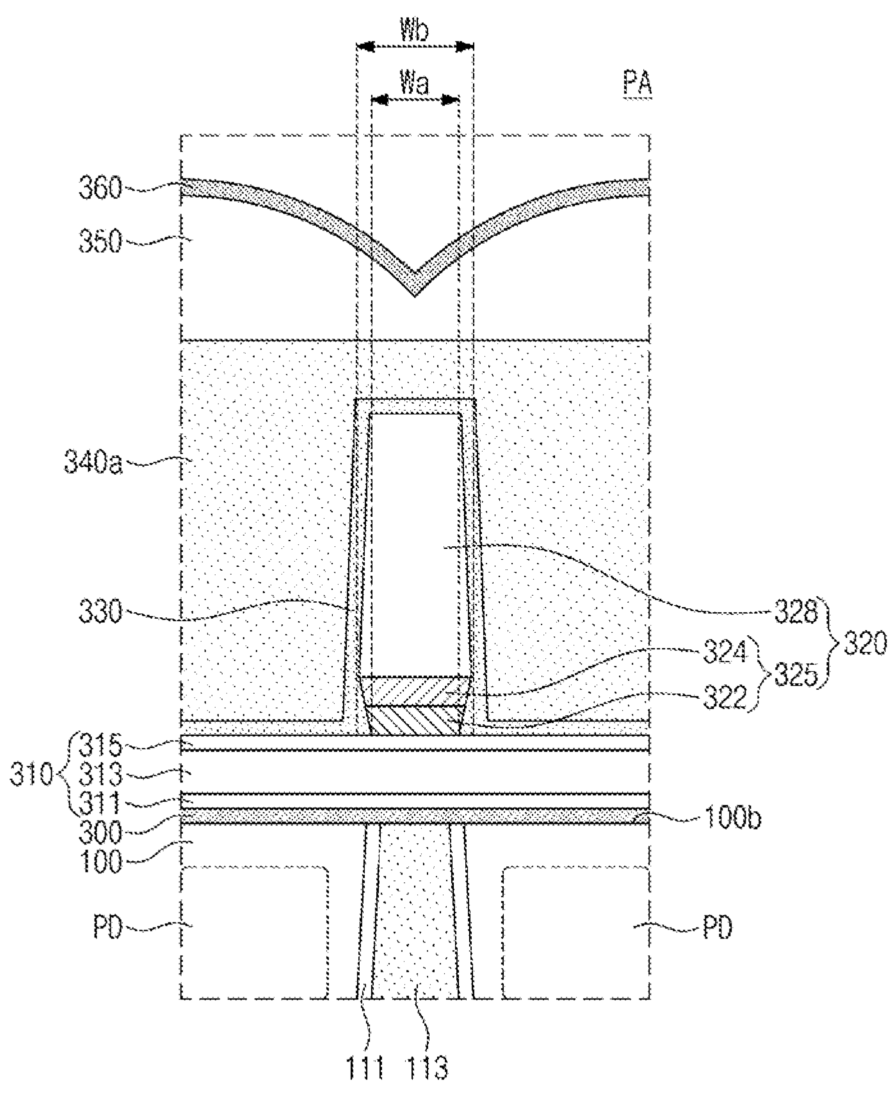
Figure 6C:
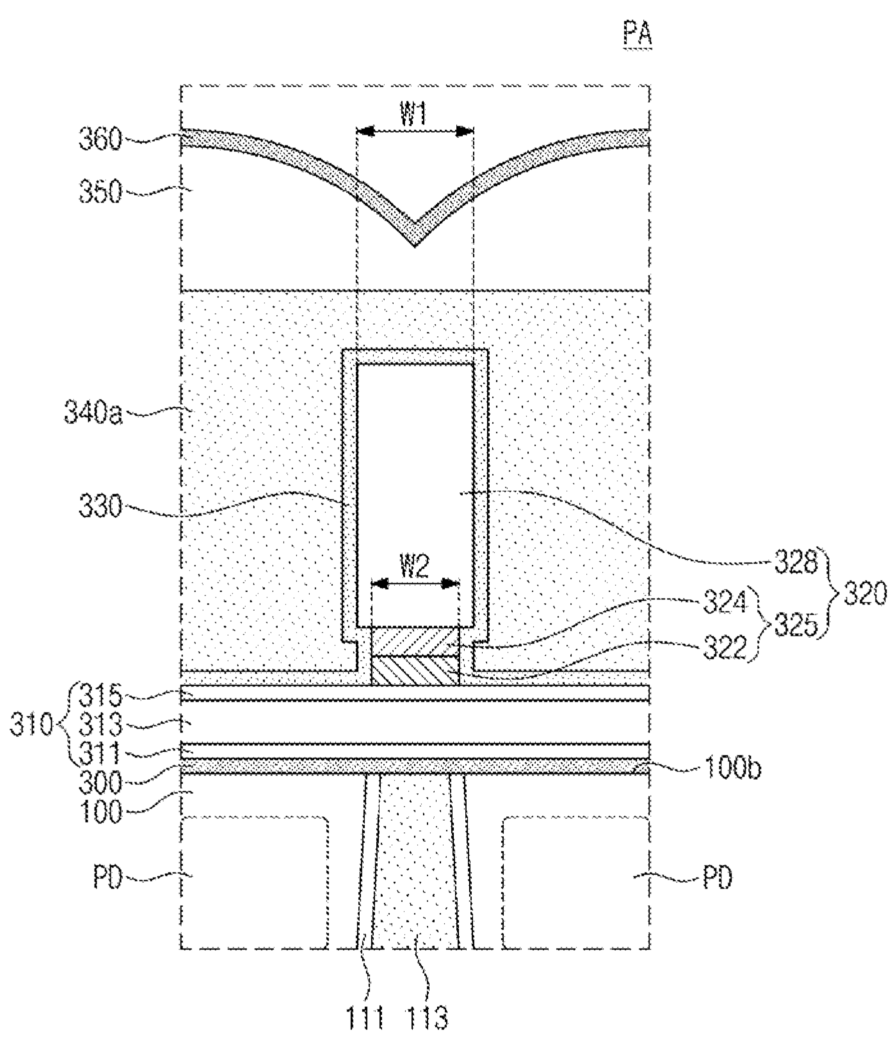

FIG. 3 illustrates a plan view showing an image sensor according to one or more example embodiments. FIG. 4 illustrates a cross-sectional view taken along line I-I' of FIG. 3, showing an image sensor according to one or more example embodiments. FIG. 5A illustrates an enlarged view showing section PA of FIG. 4. FIGS. 5B and 5C illustrate enlarged views showing section PB of FIG. 5A. FIGS. 6A, 6B, and 6C illustrate enlarged views of section PA of FIG. 4, partially showing an image sensor according to one or more example embodiments.

Referring to one or more example embodiments shown in FIGS. 3 and 4, when viewed in vertical section, an image sensor according to one or more example embodiments may include a photoelectric conversion layer 10, a readout circuit layer 20, and an optical transmission layer 30.

When viewed in vertical cross-section, the photoelectric conversion layer 10 may be disposed between the readout circuit layer 20 and the optical transmission layer 30. The photoelectric conversion layer 10 may include a semiconductor substrate 100, a pixel isolation structure PIS, and photoelectric conversion regions PD. The photoelectric conversion regions PD may convert externally incident light into electrical signals.

For example, the semiconductor substrate 100 may have a first surface (or front surface) 100*a* and a second surface (or rear surface) 100*b* that are opposite to each other. The semiconductor substrate 100 may be an epitaxial layer formed on a bulk silicon substrate that has the same first conductivity type (e.g., p-type) as that of the epitaxial layer, or a p-type epitaxial layer from which a bulk silicon substrate is removed in image sensor fabrication. Alternatively, the semiconductor substrate 100 may be a bulk semiconductor substrate that includes a well of the first conductivity type.

On each of pixel regions PR, a device isolation layer 105 may be disposed adjacent to the first surface 100*a* of the semiconductor substrate 100. The device isolation layer 105 may define an active section on the first surface 100*a* of the semiconductor substrate 100. The device isolation layer 105 may be provided in a device isolation trench that is formed by recessing the first surface 100*a* of the semiconductor substrate 100. The device isolation layer 105 may comprise a dielectric material.

The pixel isolation structure PIS may be disposed in the semiconductor substrate 100 to define a plurality of pixel regions PR. According to one or more example embodiments, the pixel regions PR may include first to third pixel regions, and the first to third pixel regions may receive light rays whose wavelengths are different from each other. The first to third pixel regions may be arranged along a first direction D1 and a second direction D2.

The pixel isolation structure PIS may vertically extend from the first surface 100*a* to the second surface 100*b* of the semiconductor substrate 100. The pixel isolation structure PIS may penetrate a portion of the device isolation layer 105.

The pixel isolation structure PIS may include first parts P1 that extend parallel to each other along the first direction D1, and may also include second parts P2 that extend parallel to each other along the second direction D2 while extending in the second direction D2 across the first parts P1. When viewed in plan view, the pixel isolation structure PIS may surround each of the pixel regions PR or the photoelectric conversion regions PD.

The pixel isolation structure PIS may have a first width at the first surface 100*a* of the semiconductor substrate 100 and a second width at the second surface 100*b* of the semiconductor substrate 100. The second width may be substantially the same as or less than the first width. For example, according to one or more example embodiments, the pixel isolation structure PIS may have a width that gradually decreases in a direction from the first surface 100*a* toward the second surface 100*b* of the semiconductor substrate 100.

According to one or more example embodiments, the pixel isolation structure PIS may have a width that gradually decreases in a direction from the second surface 100*b* toward the first surface 100*a* of the semiconductor substrate 100.

The pixel isolation structure PIS may have a length in a direction (e.g., a third direction D3) perpendicular to a surface of the semiconductor substrate 100. The length of the pixel isolation structure PIS may be substantially the same as a vertical thickness of the semiconductor substrate 100. The pixel isolation structure PIS may have an aspect ratio of about 10:1 to about 15:1.

The pixel isolation structure PIS may include a liner dielectric pattern 111, a semiconductor pattern 113, and a buried dielectric pattern 115.

The liner dielectric pattern 111 may be provided between the semiconductor pattern 113 and the semiconductor substrate 100. The liner dielectric pattern 111 may be in direct contact with the semiconductor substrate 100. The liner dielectric pattern 111 may include a material whose refractive index is less than that of the semiconductor substrate 100. The liner dielectric pattern 111 may include, for example, a silicon-based dielectric material (e.g., silicon nitride, silicon oxide, and/or silicon oxynitride) and/or a high-k dielectric material (e.g., hafnium oxide and/or aluminum oxide). Alternatively, the liner dielectric pattern 111 may include a plurality of layers, which include different materials from each other.

The semiconductor pattern 113 may include a crystalline semiconductor material, such as polysilicon. For example, the semiconductor pattern 113 may further include dopants, and the dopants may include first-conductivity-type impurities or second-conductivity-type impurities. The semiconductor pattern 113 may be formed of an undoped polysilicon layer, a doped polysilicon layer, air, or any combination thereof.

The buried dielectric pattern 115 may be disposed on a surface of the semiconductor pattern 113, and may have a top surface located at substantially the same level as that of a top surface of the device isolation layer 105. A bottom surface of the buried dielectric pattern 115 may be located at a level the same as or lower than that of a bottom surface of the device isolation layer 105.

The bottom surface of the buried dielectric pattern 115 may have a rounded shape. The buried dielectric pattern 115 may include at least one selected from a silicon oxide layer, a silicon oxynitride layer, and a silicon nitride layer.

The photoelectric conversion regions PD may be provided on corresponding pixel regions PR. The photoelectric conversion regions PD may be formed by implanting the semiconductor substrate 100 with impurities having a second conductivity type opposite to a conductivity type of the semiconductor substrate 100. A photodiode may be formed at a junction between the semiconductor substrate 100 having the first conductivity type and the photoelectric conversion region PD having the second conductivity type. The photoelectric conversion regions PD may generate photo-charges in proportion to intensity of incident light.

In one or more example embodiments, the photoelectric conversion regions PD may have a potential slope between the first surface 100*a* and the second surface 100*b* of the semiconductor substrate 100, and a difference in impurity concentration may be provided between a section adjacent to the first surface 100*a* and a section adjacent to the second surface 100*b*. For example, the photoelectric conversion regions PD may include a plurality of impurity regions that are vertically stacked.

The readout circuit layer 20 may be disposed on the first surface 100*a* of the semiconductor substrate 100. The readout circuit layer 20 may include pixel transistors (e.g., MOS transistors) electrically connected to the photoelectric conversion regions PD. For example, the readout circuit layer 20 may include the reset transistor RX, the selection transistor SEL, the double conversion gain transistor DCX, and the source follower transistor SF that are discussed above with reference to one or more example embodiments of FIGS. 2A and 2B.

On the pixel regions PR, transfer gate electrodes TG may be disposed on the first surface 100*a* of the semiconductor substrate 100. When viewed in plan view, the transfer gate electrode TG may be positioned on a central portion of each pixel region PR. A portion of the transfer gate electrode TG may be disposed in the semiconductor substrate 100, and a gate dielectric layer may be interposed between the transfer gate electrode TG and the semiconductor substrate 100. The gate dielectric layer may be formed of a silicon oxide layer, a silicon oxynitride layer, a high-k dielectric layer whose dielectric constant is greater than that of a silicon oxide layer, or any combination thereof.

A floating diffusion region FD may be provided in the semiconductor substrate 100 on one side of the transfer gate electrode TG. The floating diffusion region FD may be formed by implanting the semiconductor substrate 100 with impurities whose conductivity type is opposite to that of semiconductor substrate 100. For example, the floating diffusion region FD may be an n-type impurity region.

On each of the pixel regions PR, at least one pixel transistor may be provided spaced apart from the transfer gate electrode TG. A pixel transistor provided on each pixel region PR may be one of the reset transistor RX, the source follower transistor SF, the double conversion gain transistor DCX, and the selection transistor SEL that are discussed above with reference to one or more example embodiments of FIGS. 2A and 2B. The pixel transistor may include a pixel gate electrode and source/drain regions provided in the semiconductor substrate 100 on opposite sides of the pixel gate electrode.

The transfer gate electrode TG and the pixel gate electrode may include, for example, doped polysilicon, metal, conductive metal nitride, conductive metal silicide, conductive metal oxide, or any combination thereof.

The semiconductor substrate 100 may be provided on its first surface 100*a* with interlayer dielectric layers 210 that cover the transfer gate electrode TG and the pixel gate electrodes.

The interlayer dielectric layers 210 may have therein wiring structures 221 and 223 connected to readout circuits. The wiring structures 221 may comprise contact plugs and the wiring structures 223 may comprise metal lines that connect to the metal lines 223.

The optical transmission layer 30 may be disposed on the second surface 100*b* of the semiconductor substrate 100. The optical transmission layer 30 may include a fixed charge layer 300, an antireflection layer 310, a fence structure 320, a protection layer 330, color filters 340*a* and 340*b*, microlenses 350, and a passivation layer 360. The optical transmission layer 30 may focus and filter externally incident light, and the photoelectric conversion layer 10 may be provided with the focused and filtered light.

For example, the fixed charge layer 300 may be disposed on the second surface 100*b* of the semiconductor substrate 100. The fixed charge layer 300 may prevent the photoelectric conversion regions PD from receiving charges (e.g., electrons or holes) generated from defects present in the second surface 100*b* of the semiconductor substrate 100. The fixed charge layer 300 may include a single layer or a multiple layers. For example, the fixed charge layer 300 may include one of metal oxide and metal fluoride each of which includes at least one metal selected from hafnium (Hf), zirconium (Zr), aluminum (Al), tantalum (Ta), titanium (Ti), yttrium (Y), and lanthanide. For example, the fixed charge layer 300 may include an aluminum oxide layer and/or a hafnium oxide layer. The fixed charge layer 300 may have a thickness ranging from about 1 nm to about 50 nm.

The antireflection layer 310 may be disposed on the fixed charge layer 300. Referring to one or more example embodiments shown in FIG. 5A, according to one or more example embodiments, the antireflection layer 310 may include a first dielectric layer 311, a second dielectric layer 313, and a third dielectric layer 315 that are sequentially stacked. The first, second, and third dielectric layers 311, 313, and 315 may be formed of a transparent dielectric material. The first, second, and third dielectric layers 311, 313, and 315 may have different refractive indices from each other. The first, second, and third dielectric layers 311, 313, and 315 may be combined into a suitable thickness to have a high transmittance.

For example, according to one or more example embodiments, the first and third dielectric layers 311 and 315 may have the same refractive index, and the second dielectric layer 313 may have a refractive index different from that of the first and third dielectric layers 311 and 315. The first and third dielectric layers 311 and 315 may include metal oxide, and the second dielectric layer 313 may include silicon oxide.

The first dielectric layer 311 may be thicker than the fixed charge layer 300. The second dielectric layer 313 may be thicker than the first dielectric layer 311. The third dielectric layer 315 may be thinner than the first and second dielectric layers 311 and 313. The first dielectric layer 311 may have a thickness of, for example, about 600 Å to about 700 Å. The second dielectric layer 313 may have a thickness of, for example, about 650 Å to about 750 Å. The third dielectric layer 315 may have a thickness of, for example, about 70 Å to about 150 Å.

The fence structure 320 may be disposed on the antireflection layer 310. Similar to the pixel isolation structure PIS, the fence structure 320 may have a grid shape when viewed in plan view. When viewed in plan view, the fence structure 320 may overlap the pixel isolation structure PIS. For example, the fence structure 320 may include first parts P1 that extend in the first direction D1 and second parts P2 that extend in the second direction D2 to extend across the first parts P1. On the antireflection layer 310, the fence structure 320 may define openings that correspond to the pixel regions PR. Each opening may be defined by a pair of first parts P1 and a pair of second parts P2 of the fence structure 320. Each opening may overlap the photoelectric conversion region PD of the pixel region PR.

The fence structure 320 may be positioned between color filters 340*a* and 340*b* that are adjacent to each other on the antireflection layer 310. A minimum width of the fence structure 320 may be substantially the same as or less than that of the pixel isolation structure PIS.

The fence structure 320 may refract light that is obliquely incident through the microlens 350, and then may allow the refracted light to enter the photoelectric conversion region PD of a related pixel region PR. The fence structure 320 may have an aspect ratio ranging from about 2:1 to about 5:1. The fence structure 320 may have a height ranging from about 4,000 Å to about 7,000 Å. The fence structure 320 may have a width ranging from about 50 nm to about 150 nm.

Referring to FIG. 5A, according to one or more example embodiments, the fence structure 320 may include a barrier pattern 325 on the antireflection layer 310 and a low-refractive pattern 328 on the barrier pattern 325.

In one or more example embodiments, the barrier pattern 325 may include a metal pattern 322 (or a lower portion) and a metal oxide pattern 324 (or an upper portion) between the metal pattern 322 and the low-refractive pattern 328. An upper portion of the barrier pattern 325 may be formed of a material whose optical transmittance is greater than that of a lower portion of the barrier pattern 325. The metal oxide pattern 324 may include a material whose optical transmittance is greater than that of the metal pattern 322.

The metal pattern 322 and the metal oxide pattern 324 may include the same metallic material. For example, the metal pattern 322 and the metal oxide pattern 324 may include a metallic material, such as Ti, Ta, W, Al, Cu, and In. For example, the metal pattern 322 and the metal oxide pattern 324 may include titanium (Ti). The metal pattern 322 and the metal oxide pattern 324 may further include nitrogen (N).

The metal pattern 322 may include, for example, at least one selected from TiN, TaN, Ti, Ta, Al, W, Cu, and indium tin oxide (ITO). The metal oxide pattern 324 may include, for example, at least one selected from TiOx, TiON, and ITO.

The barrier pattern 325 may have a thickness T1 that is a sum of thicknesses of the metal pattern 322 and the metal oxide pattern 324, and the thickness T1 may range from about 40 Å to about 100 Å.

The thickness of the metal pattern 322 may be substantially the same as or different from that of the metal oxide pattern 324. Referring to FIG. 5B, according to one or more example embodiments, a thickness Ta of the metal pattern 322 may be greater than a thickness Tb of the metal oxide pattern 324.

For example, the thickness Ta of the metal pattern 322 may range from about 30 Å to about 70 Å, and the thickness Tb of the metal oxide pattern 324 may range from about 30 Å to about 60 Å.

Referring to FIG. 5C, according to one or more example embodiments, a thickness Tb of the metal oxide pattern 324 may be greater than a thickness Ta of the metal pattern 322. For example, the thickness Ta of the metal pattern 322 may range from about 30 Å to about 60 Å, and the thickness Tb of the metal oxide pattern 324 may range from about 30 Å to about 70 Å.

According to one or more example embodiments, the barrier pattern 325 may include metal and oxygen, and an oxygen concentration of the lower portion thereof may be different from that of the upper portion thereof. In the barrier pattern 325, the oxygen concentration may be greater in the upper portion than in the lower portion. In addition, the oxygen concentration in the upper portion of the barrier pattern 325 or in the metal oxide pattern 324 may increase in a direction from the metal pattern 322 toward the low-refractive pattern 328. An increase in oxygen concentration in the metal oxide pattern 324 may cause an increase in optical transmittance.

The metal pattern 322, which corresponds to the lower portion of the barrier pattern 325, may prevent bruise defects (e.g., images are partially seen blue), which may result in achievement of sharp image quality. A larger thickness of the metal pattern 322 may absorb incident light, which may result in a reduction in sensitivity of an image sensor. In one or more example embodiments, a thickness of the metal pattern 322 may be minimized to increase sensitivity of an image sensor.

Because the metal oxide pattern 324 corresponding to the upper portion of the barrier pattern 325 has an optical transmittance greater than that of the metal pattern 322, it may be possible to reduce absorption of incident light by the barrier pattern 325.

The low-refractive pattern 328 may be formed of a material whose refractive index is less than that of the barrier pattern 325. In addition, the low-refractive pattern 328 may be formed of a material whose refractive index is less than those of color filters 340*a* and 340*b*. The low-refractive pattern 328 may be formed of an organic material and may have a refractive index ranging from about 1.1 to about 1.3. Because the low-refractive pattern 328 has a low refractive index, it may be possible to increase an amount of light that is incident onto the photoelectric conversion region PD and to reduce cross-talk between the pixel regions PR. In this configuration, each of the photoelectric conversion regions PD may increase in light-receiving efficiency and improve in signal-to-noise ratio (SNR).

The low-refractive pattern 328 may include silicon oxide, such as tetraethylorthosilicate (TEOS). The low-refractive pattern 328 may be, for example, a polymer layer including silica nano-particles. The low-refractive pattern 328 may include at least one selected from a SiOCH layer, a SiOC layer, and a SiOF layer.

In the fence structure 320, a sidewall of the low-refractive pattern 328 may be aligned with that of the barrier pattern 325.

Referring to FIG. 6A, according to one or more example embodiments, the fence structure 320 may have an upper width W1 less than a width W2 thereof, and may also have an inclined sidewall. The upper width W1 of the fence structure 320 may correspond to an upper width of the low-refractive pattern 328. The fence structure 320 may have a width that gradually decreases in a direction from lower toward upper portions thereof. The fence structure 320 may have a maximum width at a bottom surface of the metal pattern 322 and a minimum width at a top surface of the low-refractive pattern 328.

Referring to FIG. 6B, according to one or more example embodiments, the fence structure 320 may have a minimum width Wa at a bottom surface of the barrier pattern 325 and a maximum width Wb at a bottom surface of the low-refractive pattern 328. The barrier pattern 325 may have a width that increases in a direction from lower toward upper portions thereof.

Referring to FIG. 6C, according to one or more example embodiments, an upper width W1 of the low-refractive pattern 328 may be greater than a width W2 of the barrier pattern 325. A sidewall of the low-refractive pattern 328 may be misaligned with that of the barrier pattern 325.

Referring back to FIGS. 3 and 4, according to one or more example embodiments, on the antireflection layer 310, the protection layer 330 may have a substantially uniform thickness that covers a surface of the fence structure 320. For example, the protection layer 330 may have a substantially uniform thickness that covers a top surface and sidewalls of the fence structure 320. Between the sidewalls of the fence structure 320 and sidewalls of the color filters 340*a* and 340*b*, the protection layer 330 may extend between the antireflection layer 310 and bottom surfaces of the color filters 340*a* and 340*b*.

The protection layer 330 may protect the color filters 340*a* and 340*b* and prevent the low-refractive pattern 328 from being subjected to moisture or contamination. The protection layer 330 may be formed of a hydrophobic layer. The protection layer 330 may be a silicon oxide-based dielectric layer including impurities. For example, the protection layer 330 may include silicon oxide containing carbon (C) or nitrogen (N). The protection layer 330 may include a SiOCH layer, a SiOC layer, a SiOF layer, a SiN layer, a SiCN layer, or a SiC layer. The protection layer 330 may be, for example, a $SiO_xC_{2-x}$ layer or a $SiO_xN_{1-x}$ layer. The protection layer 330 may have a thickness ranging from about 10 Å to about 200 Å. Because the protection layer 330 is formed to have a thickness of about 10 Å to about 200 Å, the protection layer 330 may not affect pathways of light incident onto the pixel regions PR.

The color filters 340*a* and 340*b* may be disposed in openings of the fence structure 320 on which the protection layer 330 is formed.

The color filters 340*a* and 340*b* may be formed to correspond to the pixel regions PR. The color filters 340*a* and 340*b* may fill the openings defined by the fence structure 320. In accordance with a unit pixel, the color filters 340*a* and 340*b* may each include one of red, green, and blue filters or one of magenta, cyan, and yellow color filters.

The color filters 340*a* and 340*b* may provide three or four color filters. For example, the pixel regions PR may include first, second, and third pixel regions, and first, second, and third color filters may be respectively provided on the first to third pixel regions. The first, second, and third color filters may include red, green, and blue color filters. Alternatively, the first, second, and third color filters may include magenta, yellow, and cyan color filters.

According to one or more example embodiments, at least two first color filters 340*a* may be disposed between neighboring second color filters 340*b*. Alternatively, three or four first color filters 340*a* may be disposed between neighboring second color filters 340*b*. A portion of the fence structure 320 may be disposed between the color filers 340*a* or 340*b* having the same color, and another portion of the fence structure 320 may be disposed between the color filters 340*a* and 340*b* having different colors.

The microlenses 350 may be disposed on the color filters 340*a* an 340*b*. The microlenses 350 may each have a convex shape with a certain curvature radius. The microlenses 350 may be formed of a light-transmitting resin.

The passivation layer 360 may conformally cover surfaces of the microlenses 350. The passivation layer 360 may be formed of, for example, inorganic oxide.

Figure 7:
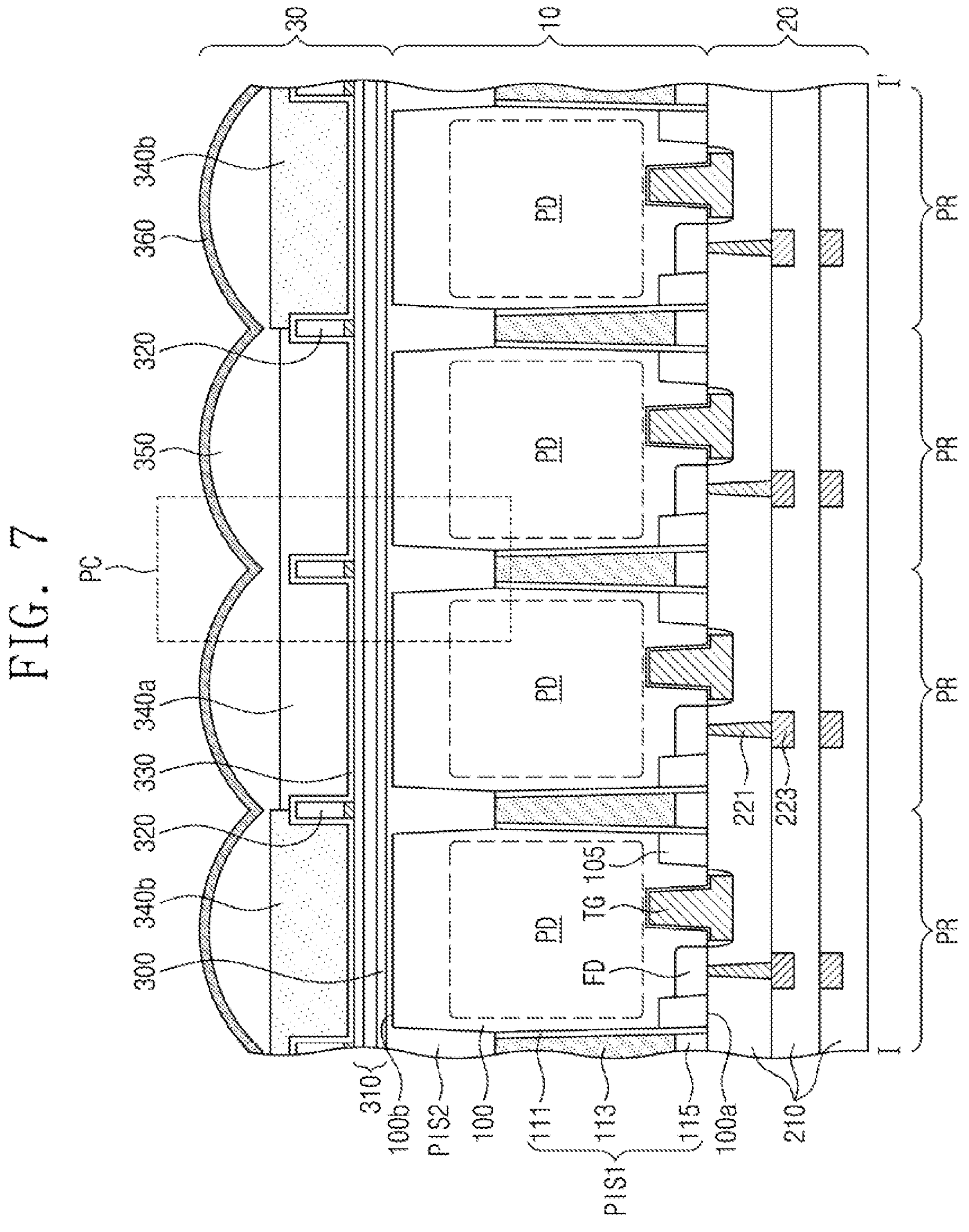
FIG. 7 illustrates a cross-sectional view taken along line I-I' of FIG. 3, showing an image sensor according to one or more example embodiments.
Figure 8:
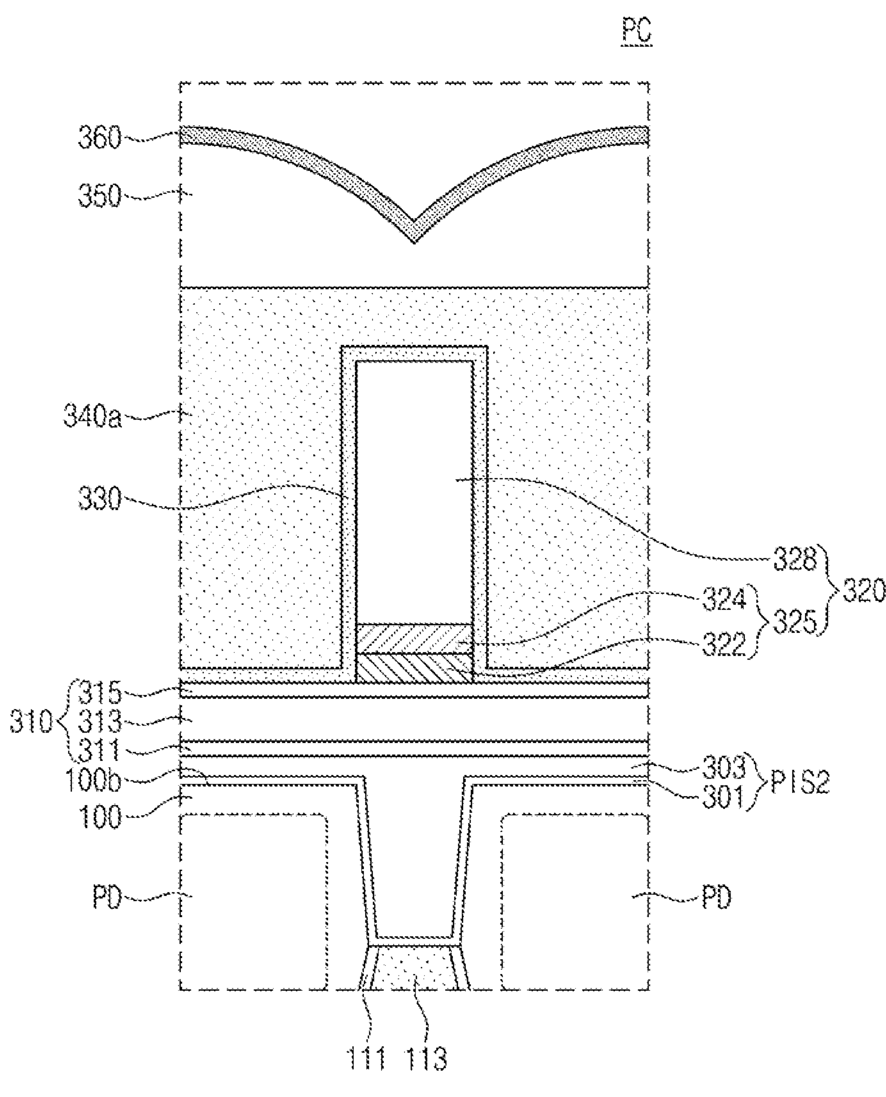
FIG. 8 illustrates an enlarged view showing section PC of FIG. 7 according to one or more example embodiments.

FIG. 7 illustrates a cross-sectional view taken along line I-I' of FIG. 3, showing an image sensor according to one or more example embodiments. FIG. 8 illustrates an enlarged view showing section PC of FIG. 7 according to one or more example embodiments. The same technical features as those of the image sensor discussed above may be omitted in the interest of brevity of description.

Referring to one or more example embodiments shown in FIGS. 7 and 8, an image sensor according to one or more example embodiments may include first and second pixel isolation structures PIS1 and PIS2 that define the pixel regions PR.

The first pixel isolation structure PIS1 may extend in a direction (e.g., the third direction D3) perpendicular to the first surface 100*a* of the semiconductor substrate 100, thereby being provided in the semiconductor substrate 100. The first pixel isolation structure PIS1 may be provided in a trench that is recessed from the first surface 100*a* of the semiconductor substrate 100.

The first pixel isolation structure PIS1 may have a top surface substantially coplanar with the first surface 100*a* of the semiconductor substrate 100. The top surface of the first pixel isolation structure PIS1 may be substantially coplanar with that of the device isolation layer 105.

The first pixel isolation structure PIS1 may have a bottom surface between the first surface 100*a* and the second surface 100*b* of the semiconductor substrate 100. The first pixel isolation structure PIS1 may be spaced apart from the second surface 100*b* of the semiconductor substrate 100. The first pixel isolation structure PIS1 may have a first upper width at the first surface 100*a* of the semiconductor substrate 100 and a first lower width at the bottom surface of the first pixel isolation structure PIS1. The first lower width may be substantially the same as or less than the first upper width. For example, according to one or more example embodiments, the first pixel isolation structure PIS1 may have a width that gradually decreases in a direction from the first surface 100*a* toward the second surface 100*b* of the semiconductor substrate 100. The first pixel isolation structure PIS1 may have a first length in a direction (e.g., the third direction D3) perpendicular to a surface of the semiconductor substrate 100.

As discussed above, according to one or more example embodiments, the first pixel isolation structure PIS1 may include a liner dielectric pattern 111, a semiconductor pattern 113, and a buried dielectric pattern 115.

The second pixel isolation structure PIS2 may extend in a direction (e.g., the third direction D3) perpendicular to the second surface 100*b* of the semiconductor substrate 100, thereby being provided in the semiconductor substrate 100. The second pixel isolation structure PIS2 may be provided in a trench that is recessed from the second surface 100*b* of the semiconductor substrate 100.

The second pixel isolation structure PIS2 may have a bottom surface between the first surface 100*a* and the second surface 100*b* of the semiconductor substrate 100. For example, the second pixel isolation structure PIS2 may be spaced apart from the first surface 100*a* of the semiconductor substrate 100. The second pixel isolation structure PIS2 may be in contact with the first pixel isolation structure PIS1. The second pixel isolation structure PIS2 may be in contact with the liner dielectric pattern 111 and the semiconductor pattern 113 of the first pixel isolation structure PIS1. A bottom surface of the liner dielectric pattern 111 may be in contact with a portion of the second pixel isolation structure PIS2.

The second pixel isolation structure PIS2 may have a second upper width at the second surface 100*b* of the semiconductor substrate 100 and a second lower width at the bottom surface of the second pixel isolation structure PIS2. The second lower width may be substantially the same as or less than the second upper width. The second pixel isolation structure PIS2 may have a width that gradually decreases in a direction from the second surface 100*b* toward the first surface 100*a* of the semiconductor substrate 100.

The second pixel isolation structure PIS2 may have a planar structure substantially the same as that of the first pixel isolation structure PIS1. When viewed in plan view, the second pixel isolation structure PIS2 may overlap the first pixel isolation structure PIS1. For example, the second pixel isolation structure PIS2 may overlap the fence structure 320.

The second pixel isolation structure PIS2 may have a second length in a vertical direction (e.g., the third direction D3), and the second length may be different from the first length of the first pixel isolation structure PIS1. For example, the second length of the second pixel isolation structure PIS2 may be substantially the same as the first length of the first pixel isolation structure PIS1.

The second pixel isolation structure PIS2 may be formed of at least one high-k dielectric layer whose dielectric constant is greater than that of a silicon oxide layer. For example, the second pixel isolation structure PIS2 may include a surface dielectric layer 301 and a gap-fill dielectric layer 303.

The surface dielectric layer 301 may have a uniform thickness that covers an inner wall of a trench that is recessed from the second surface 100*b* of the semiconductor substrate 100 and also covers the second surface 100*b* of the semiconductor substrate 100. The gap-fill dielectric layer 303 may fill the trench in which the surface dielectric layer 301 is formed, and may have a top surface that is substantially flat on the second surface 100*b* of the semiconductor substrate 100. The surface dielectric layer 301 and the gap-fill dielectric layer 303 may include one of metal oxide and metal fluoride and each includes at least one metal selected from hafnium (Hf), zirconium (Zr), aluminum (Al), tantalum (Ta), titanium (Ti), yttrium (Y), and lanthanide. For example, the surface dielectric layer 301 may include an aluminum oxide layer, and the gap-fill dielectric layer 303 may include a hafnium oxide layer.

The antireflection layer 310 may be disposed on the gap-fill dielectric layer 303 of the second pixel isolation structure PIS2.

Figure 9:
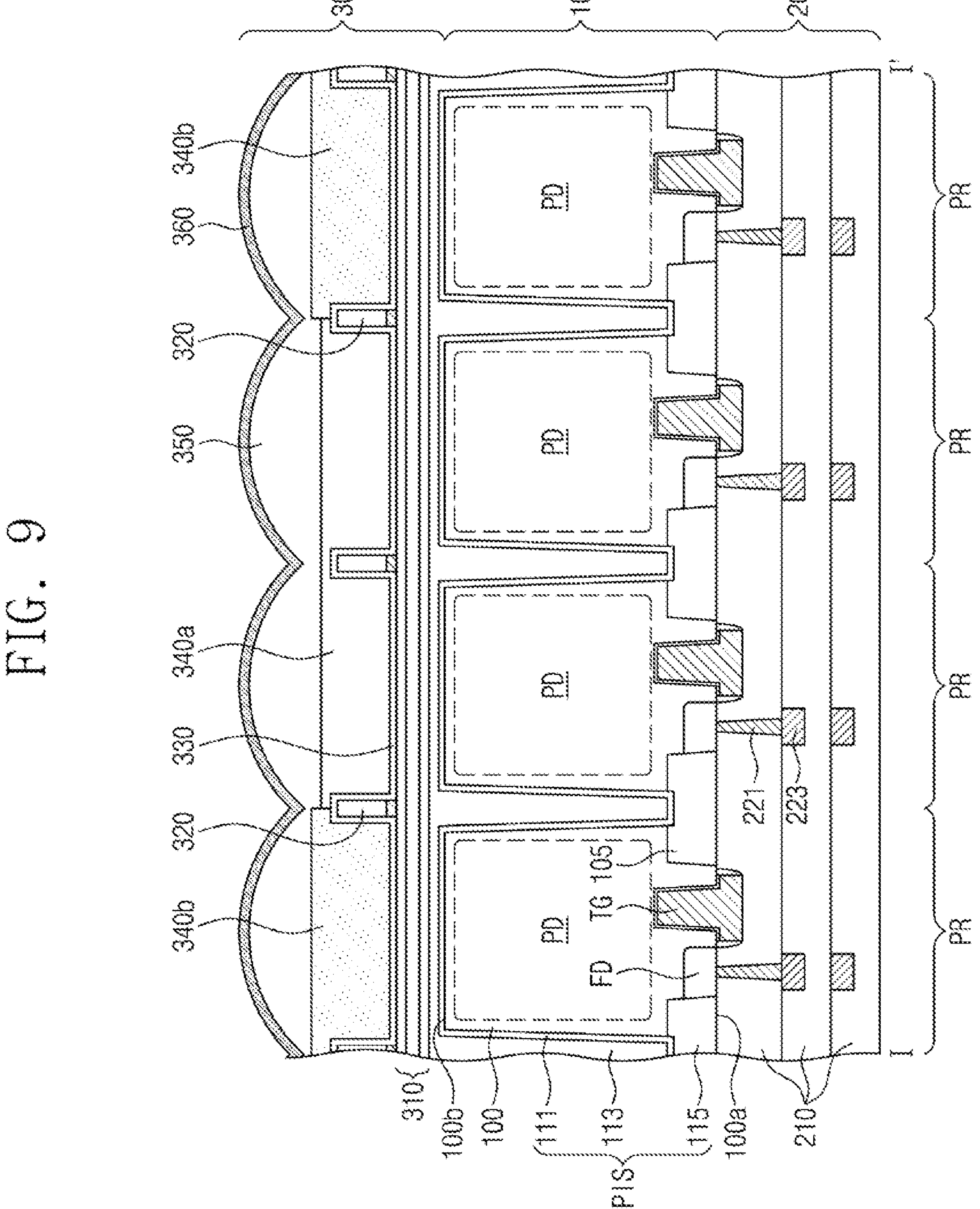
FIG. 9 illustrates a cross-sectional view taken along line I-I' of FIG. 3, showing an image sensor according to one or more example embodiments.

FIG. 9 illustrates a cross-sectional view taken along line I-I' of FIG. 3, showing an image sensor according to one or more example embodiments. Duplicate technical features as those of the image sensor discussed above according to one or more example embodiments may be omitted in the interest of brevity.

Referring to one or more example embodiments shown in FIG. 9, the pixel isolation structure PIS defining the pixel regions PR may be disposed in a trench that is recessed from the second surface 100*b* of the semiconductor substrate 100. The pixel isolation structure PIS may have an upper width at the second surface 100*b* of the semiconductor substrate 100 and a lower width at a bottom surface of the pixel isolation structure PIS adjacent the first surface 100*a*. The lower width may be substantially the same as or less than the upper width. For example, the pixel isolation structure PIS may have a width that gradually decreases in a direction from the first surface 100*a* toward the second surface 100*b* of the semiconductor substrate 100.

The pixel isolation structure PIS may have a top surface substantially coplanar with the second surface 100*b* of the semiconductor substrate 100. The bottom surface of the pixel isolation structure PIS may be in contact with the device isolation layer 105.

The pixel isolation structure PIS may include a surface dielectric layer 301 and a gap-fill dielectric layer 303. The surface dielectric layer 301 may have a uniform thickness that covers an inner wall of a trench that is recessed from the second surface 100*b* of the semiconductor substrate 100 and also covers the second surface 100*b* of the semiconductor substrate 100. The surface dielectric layer 301 may be in contact with the device isolation layer 105. The gap-fill dielectric layer 303 may fill the trench in which the surface dielectric layer 301 is formed, and may have a top surface that is substantially flat on the second surface 100*b* of the semiconductor substrate 100. The antireflection layer 310 may be disposed on the gap-fill dielectric layer 303 of the pixel isolation structure PIS.

FIGS. 10, 11, 12, 13A, 13B, 14A, 14B, 15, 16 and 17 illustrate cross-sectional views taken along line I-I' of FIG. 3, showing a method of fabricating an image sensor according to one or more example embodiments.

Figure 10:
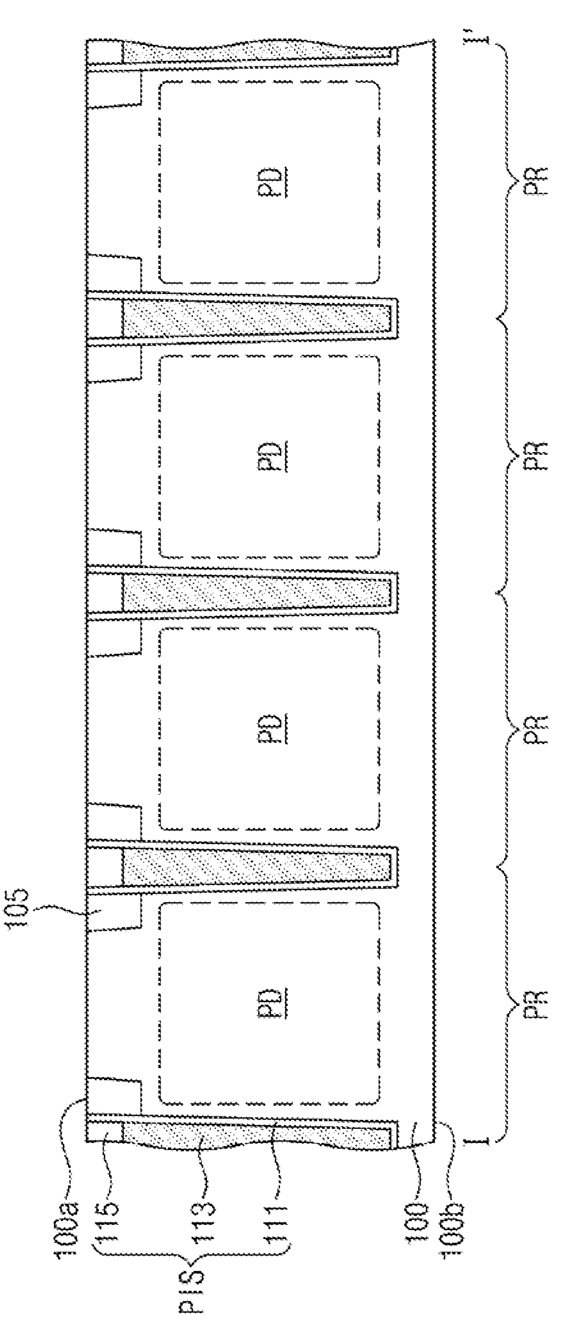
FIGS. 10, 11, 12, 13A, 13B, 14A, 14B, 15, 16 and 17 illustrate cross-sectional views taken along line I-I' of FIG. 3, showing a method of fabricating an image sensor according to one or more example embodiments.

Referring to one or more example embodiments shown in FIGS. 3 and 10, a semiconductor substrate 100 may be provided which has a first conductivity type (e.g., p-type). The semiconductor substrate 100 may have a first surface 100*a* and a second surface 100*b* that are opposite to each other.

The semiconductor substrate 100 may include an epitaxial layer formed on a bulk silicon substrate that has the same first conductivity type as that of the epitaxial layer. The epitaxial layer may be formed by performing a selective epitaxial growth (SEG) process in which the bulk silicon substrate is used as a seed, and impurities having the first conductivity type may be doped during the selective epitaxial growth process. For example, the epitaxial layer may include p-type impurities.

Alternatively, the semiconductor substrate 100 may be a bulk semiconductor substrate including a well having the first conductivity type. Dissimilarly, the semiconductor substrate 100 may be a silicon-on-insulator (SOI) substrate, a germanium substrate, a germanium-on-insulator (GOI) substrate, or a silicon-germanium substrate.

On each pixel region PR, a device isolation layer 105 may be formed which is adjacent to the first surface 100*a* of the semiconductor substrate 100 and defines active sections of the semiconductor substrate 100. The device isolation layer 105 may be formed by forming a shallow trench by patterning the first surface 100*a* of the semiconductor substrate 100 and then depositing a dielectric material in the shallow trench. The formation of the device isolation layer 105 may be performed before or after the formation of photoelectric conversion regions PD.

Pixel isolation structure PIS may be formed to define the pixel regions PR on the semiconductor substrate 100. The formation of the pixel isolation structure PIS may include forming a deep trench by patterning the first surface 100*a* of the first semiconductor substrate 100, forming a liner dielectric layer that conformally covers an inner wall of the deep trench, depositing a semiconductor layer to fill the deep trench in which the liner dielectric layer is formed, and forming in the deep trench a liner dielectric pattern 111, a semiconductor pattern 113, and a buried dielectric pattern 115 by planarizing the liner dielectric layer and the semiconductor layer so as to expose the first surface 100*a* of the first semiconductor substrate 100. The liner dielectric pattern 111 and the buried dielectric pattern 115 may include, but are not limited to, for example, silicon oxide, silicon nitride, and/or silicon oxynitride. The semiconductor pattern 113 may include an impurity-doped polysilicon layer and/or an undoped polysilicon layer.

The photoelectric conversion regions PD having a second conductivity type may be formed in the semiconductor substrate 100.

The photoelectric conversion regions PD may be formed by doping the semiconductor substrate 100 with impurities having the second conductivity type (e.g., n-type) opposite to the first conductivity type. The photoelectric conversion regions PD may be spaced apart from the first surface 100*a* and the second surface 100*b* of the semiconductor substrate 100.

In one or more example embodiments, after the pixel isolation structure PIS is formed and thereafter the photoelectric conversion regions PD are formed, but according to one or more example embodiments the photoelectric conversion regions PD may be formed before the pixel isolation structure PIS is formed.

Figure 11:
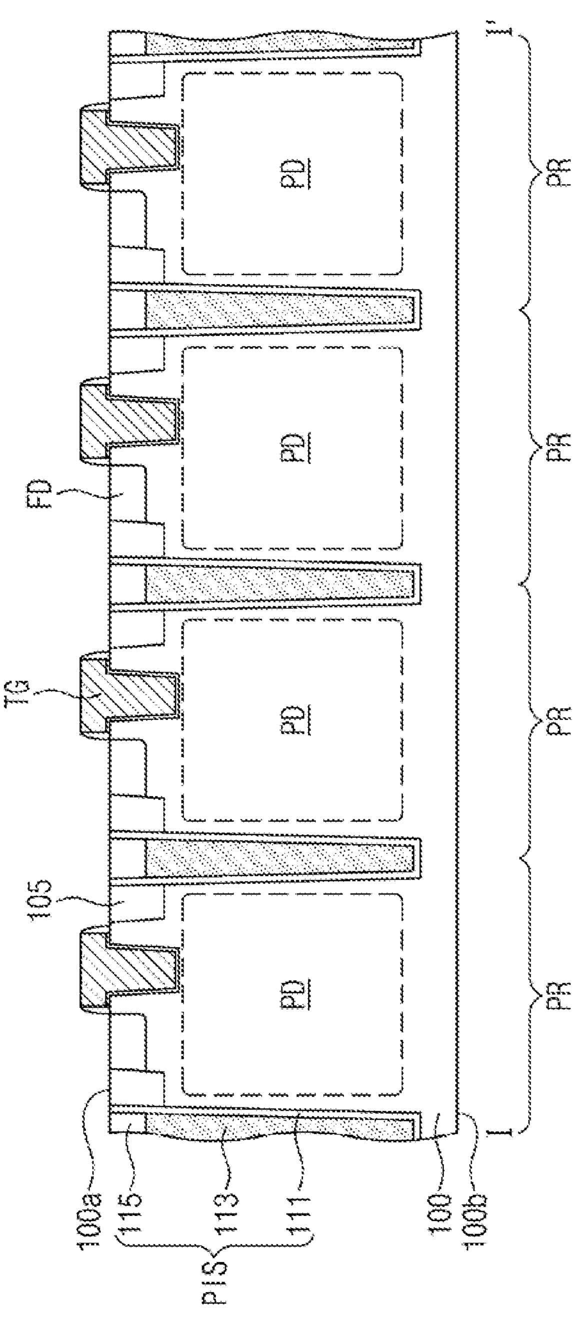

Referring to one or more example embodiments shown in FIGS. 3 and 11, transfer transistors and pixel transistors may be formed on the first surface 100*a* of the semiconductor substrate 100.

For example, transfer gate electrodes TG may be correspondingly formed on the pixel regions PR. The formation of the transfer gate electrodes TG may include patterning the semiconductor substrate 100 to form a gate recess region on each of the pixel regions PR, forming a gate dielectric layer that conformally covers an inner wall of the gate recess region, forming a gate conductive layer that fills the gate recess region, and patterning the gate conductive layer.

In addition, when the gate conductive layer is patterned to form the transfer gate electrodes TG, gate electrodes of the pixel transistors may also be correspondingly formed on the pixel regions PR.

After the formation of the transfer gate electrodes TG, floating diffusion regions FD may be formed in the semiconductor substrate 100 on sides of the transfer gate electrodes TG. The floating diffusion regions FD may be formed by implanting impurities having the second conductivity type. When the floating diffusion regions FD are formed, source/drain impurity regions of the pixel transistors may also be formed.

Figure 12:
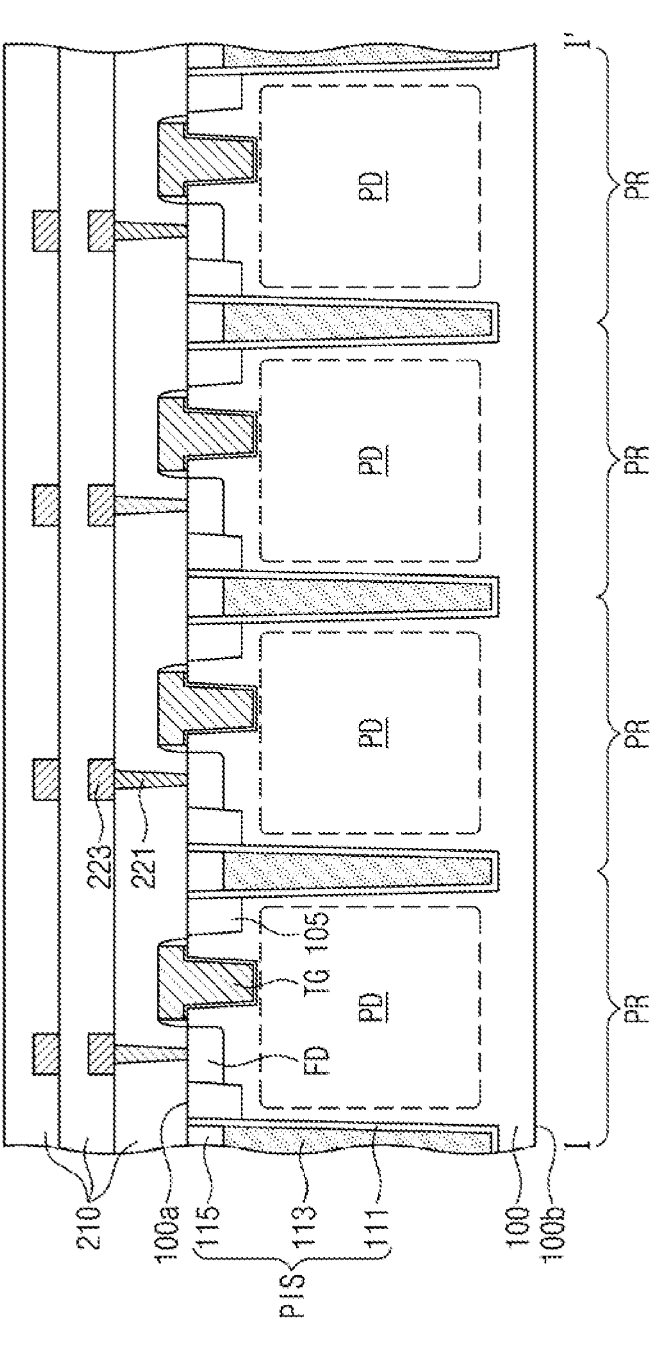

Referring to one or more example embodiments shown in FIG. 12, interlayer dielectric layers 210 and a wiring structure 221 and 223 may be formed on the first surface 100*a* of the semiconductor substrate 100.

The interlayer dielectric layers 210 may cover transfer transistors and logic transistors. The interlayer dielectric layers 210 may be formed of a material having superior gap-fill characteristics, and may have planarized upper portions.

A plurality of contact plugs 221 may be formed in the interlayer dielectric layers 210 and may connect with the floating diffusion region FD or readout transistors. A plurality of metal lines 223 may be formed in the interlayer dielectric layers 210. The contact plugs 221 and the metal lines 223 may comprise, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or any alloy thereof.

Figure 13A:
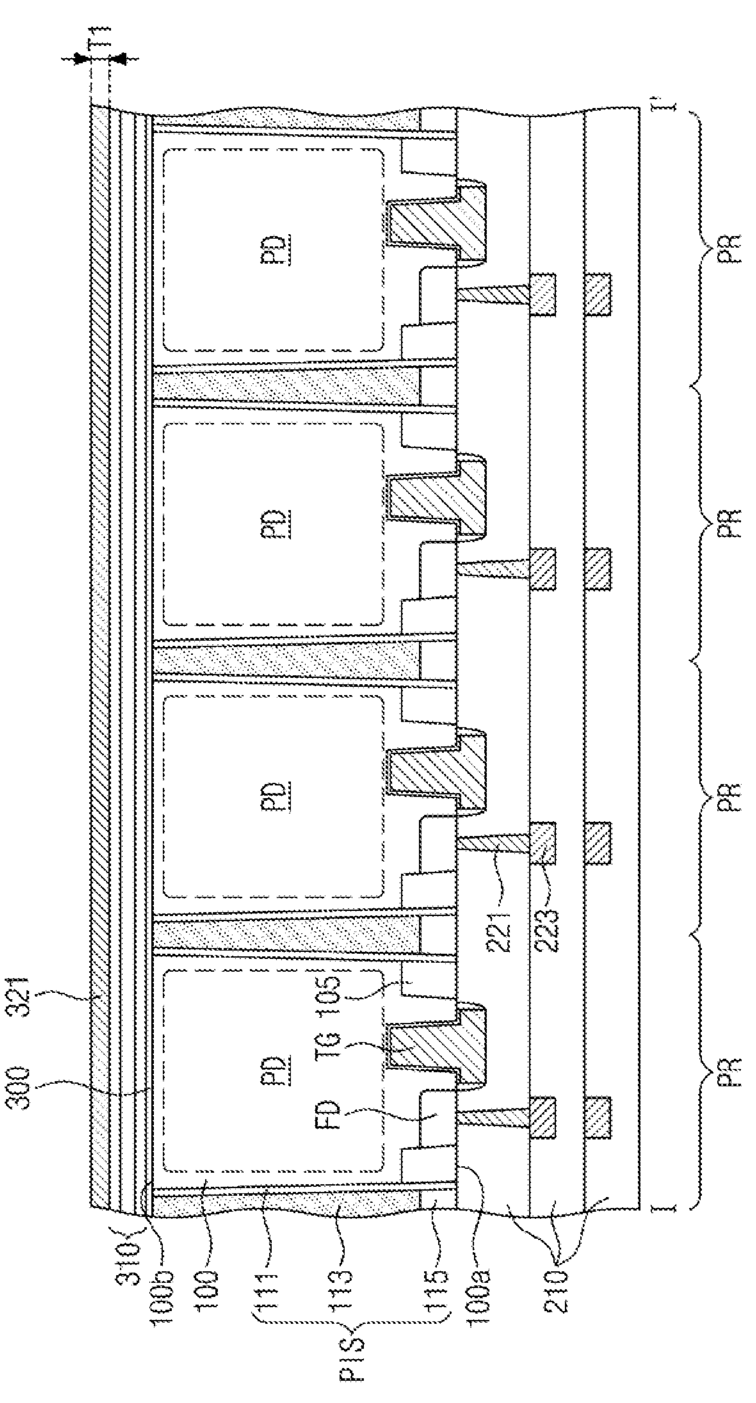

Referring to one or more example embodiments shown in FIG. 13A, a thinning process may be performed to remove a portion of the semiconductor substrate 100, and thus the semiconductor substrate 100 may decrease in vertical thickness. The thinning process may include grinding or polishing the second surface 100*b* of the semiconductor substrate 100 and/or anisotropically or isotropically etching the second surface 100*b* of the semiconductor substrate 100. The semiconductor substrate 100 may be turned upside down to perform the thinning process thereon.

For example, a grinding or polishing process may be performed to remove the bulk silicon substrate of the first semiconductor substrate 100 and to expose the epitaxial layer. After that, an anisotropic or isotropic etching process may be performed to remove surface defects present on an exposed surface of the epitaxial layer. The exposed surface of the epitaxial layer may correspond to the second surface 100*b* of the semiconductor substrate 100.

The thinning process performed on the semiconductor substrate 100 may expose the semiconductor pattern 113 of the pixel isolation structure PIS on the second surface 100*b* of the semiconductor substrate 100. The semiconductor pattern 113 and the liner dielectric pattern 111 may have surfaces located at substantially the same level as that of the second surface 100*b* of the semiconductor substrate 100.

Referring still to one or more example embodiments shown in FIG. 13A, a fixed charge layer 300 may be formed on the second surface 100*b* of the thinned semiconductor substrate 100. The fixed charge layer 300 may directly cover the second surface 100*b* of the semiconductor substrate 100. The fixed charge layer 300 may comprise metal oxide, such as aluminum oxide and/or hafnium oxide, but one or more example embodiments are not limited thereto. The fixed charge layer 300 may be formed to a thickness of about 1 nm to about 50 nm.

An antireflection layer 310 may be formed on the fixed charge layer 300. The antireflection layer 310 may include a plurality of dielectric layers.

The antireflection layer 310 may be formed by sequentially stacking a first dielectric layer 311, a second dielectric layer 313, and a third dielectric layer 315. The first, second, and third dielectric layers 311, 313, and 315 may comprise a transparent dielectric material. The first, second, and third dielectric layers 311, 313, and 315 may have different refractive indices different from each other. The first, second, and third dielectric layers 311, 313, and 315 may be combined into a suitable thickness to have a high transmittance. The first, second, and third dielectric layers 311, 313, and 315 may be formed by performing a chemical vapor deposition (CVD) process or an atomic layer deposition (ALD) process.

Referring again to one or more example embodiments shown in FIG. 13A, a metal layer 321 may be deposited on the antireflection layer 310. The metal layer 321 may be formed by performing a physical vapor deposition (PVD) process (e.g., sputtering), a chemical vapor deposition (CVD) process, or an atomic layer deposition (ALD) process.

For example, the deposition of the metal layer 321 may include using a physical vapor deposition process to deposit a TiN layer. In this operation, the metal layer 321 may be deposited to a first thickness T1, and the first thickness T1 may be a minimum deposition thickness or greater than the minimum deposition thickness. In this description, the minimum deposition thickness may indicate a minimum thickness of a continuous layer that can be formed using a deposition apparatus.

Figure 14A:
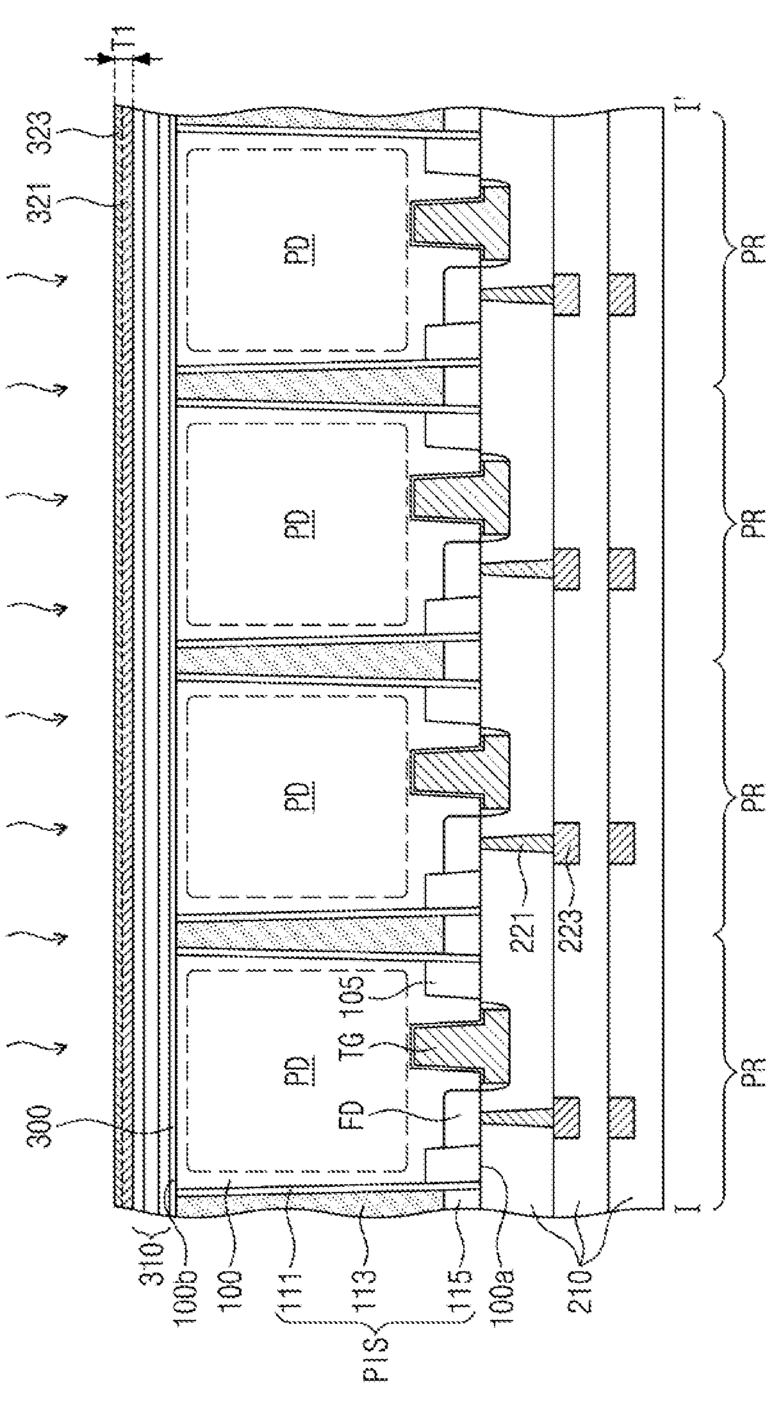

Referring to one or more example embodiments shown in FIG. 14A, an oxidation process may be performed on the metal layer 321 having the first thickness T1. The oxidation process may be performed such that an upper portion of the metal layer 321 is oxidized to form a metal oxide layer 323. In this operation, the oxidation process may include a plasma oxidation process or a rapid thermal oxidation process. Alternatively, the metal layer 321 may undergo an $O_2$ or $O_3$ plasma ashing process may be performed to form the metal oxide layer 323 on the metal layer 321.

Figure 13B:
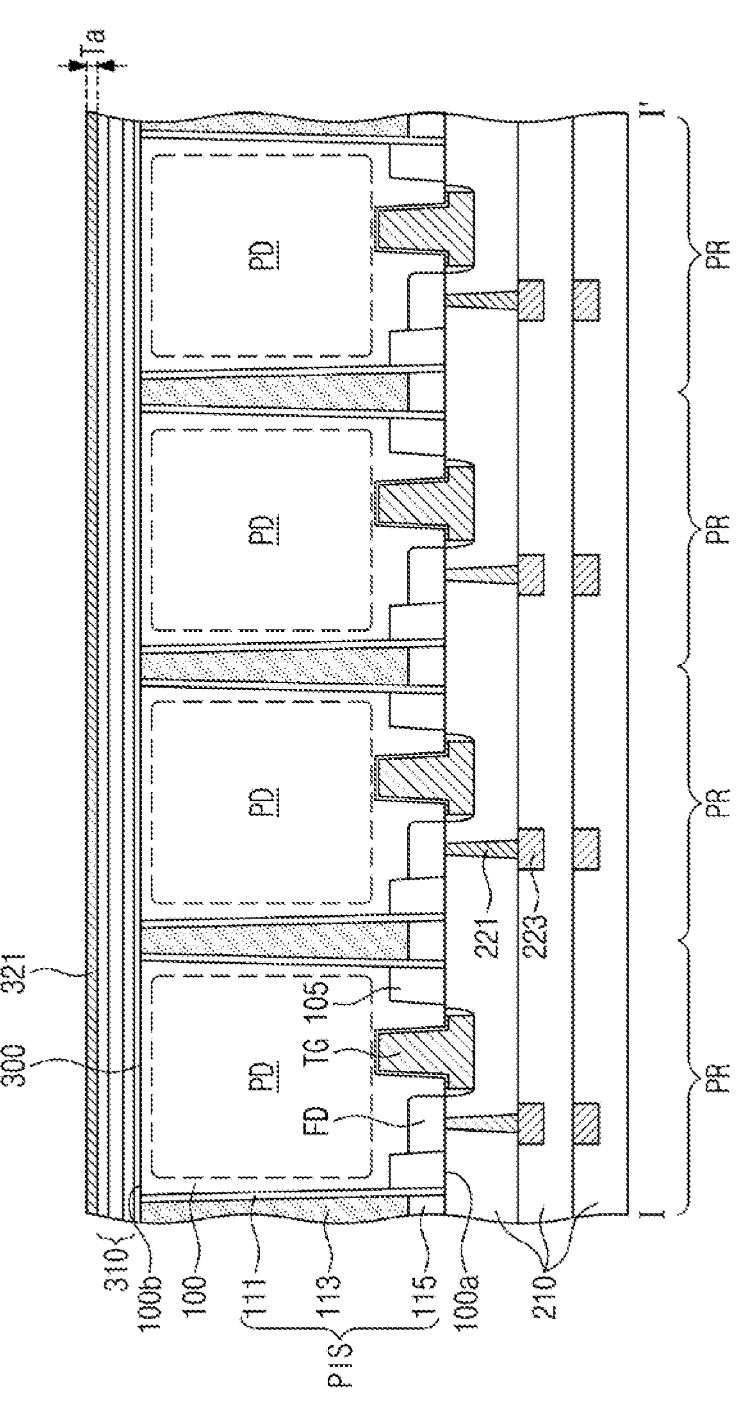

According to one or more example embodiments shown in FIG. 13B, after the formation of the antireflection layer 310, the deposition of the metal layer 321 may include using a physical vapor deposition (PVD) process to deposit a TiN layer. When the metal layer 321 is formed, a deposition process may be performed to allow the metal layer 321 to have a minimum deposition thickness Ta. The minimum deposition thickness Ta may range from about 50 Å to about 100 Å.

Figure 14B:
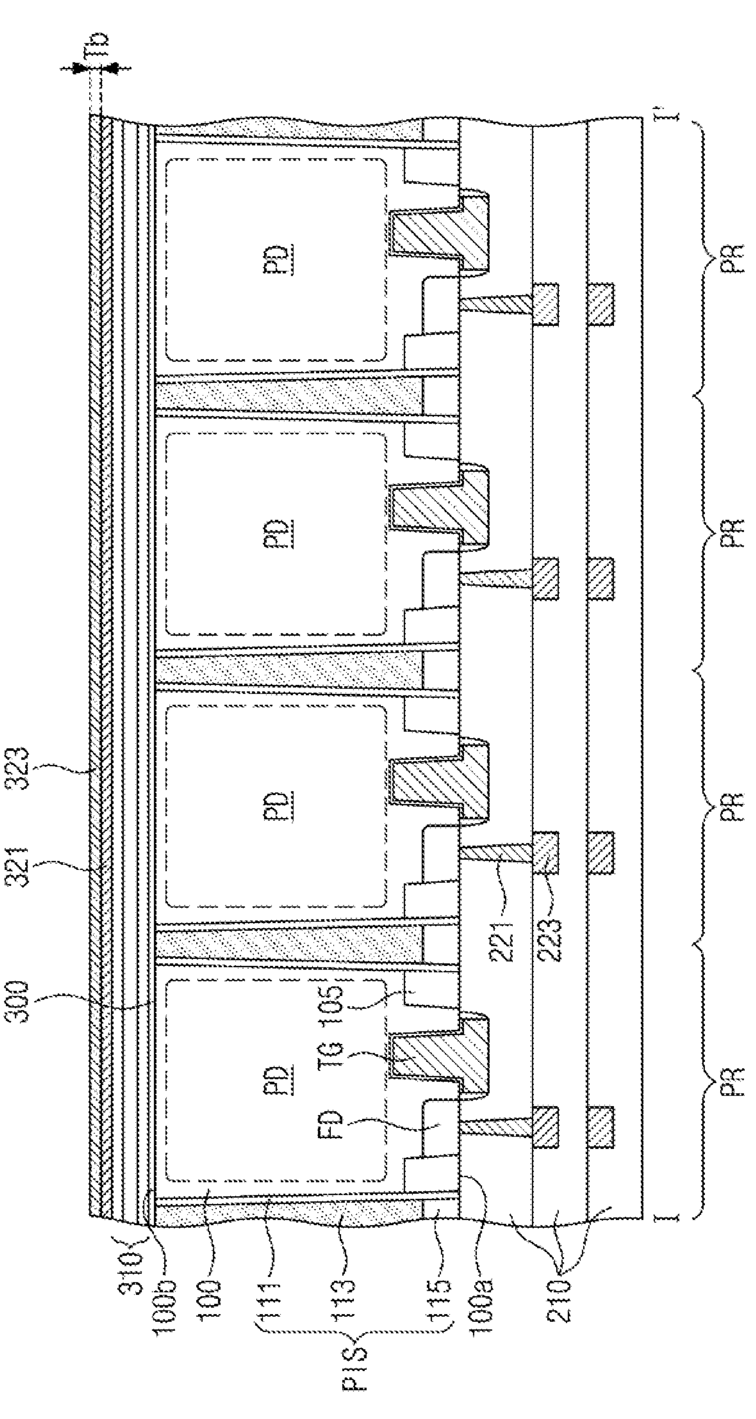

Referring to one or more example embodiments shown in FIG. 14B, a metal oxide layer 323 may be deposited to have a second thickness Tb on the metal layer 321 having the minimum deposition thickness Ta. The metal oxide layer 323 may be formed by, for example, a physical vapor deposition process, a chemical vapor deposition process, or an atomic layer deposition process.

According to one or more example embodiments, the antireflection layer 310 may undergo a deposition process to form a barrier layer including a metallic material. During the deposition process, a metal source and oxygen may be provided, and a flow rate of oxygen may gradually increase to form the barrier layer. In this case, an oxygen concentration may be greater in an upper portion of the barrier layer than in a lower portion of the barrier layer. For example, the lower portion of the barrier layer may include TiN, and the upper portion of the barrier layer may include TiON.

Figure 15:
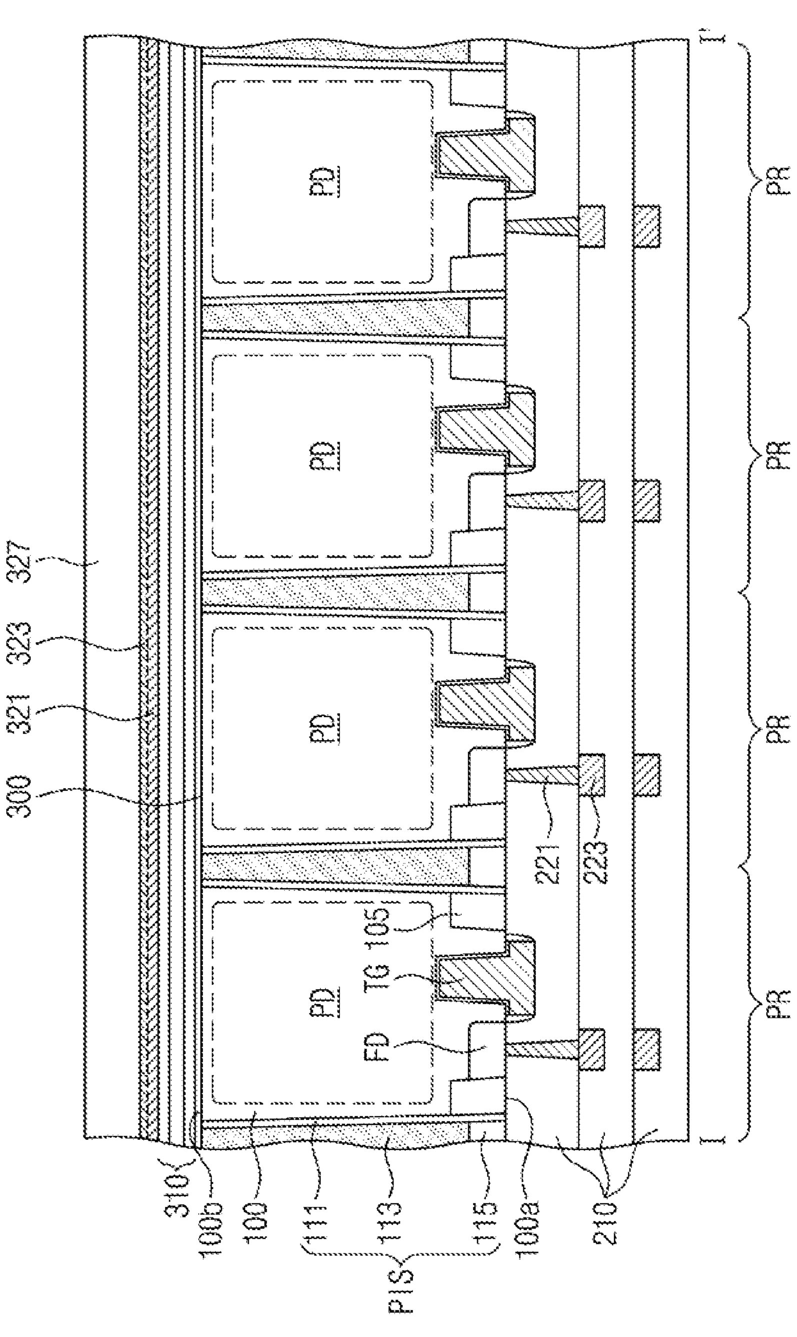

Referring to one or more example embodiments shown in FIG. 15, a low-refractive layer 327 may be formed on the metal oxide layer 323. As discussed above, the low-refractive layer 327 may comprise a material whose refractive index ranges from about 1.1 to about 1.3. The low-refractive layer 327 may include a silicon-containing material. The silicon-containing material may include silicon oxide, such as tetraethylorthosilicate (TEOS). The low-refractive layer 327 may be formed by plasma enhanced chemical vapor deposition, but one or more example embodiments are not limited thereto.

Figure 16:
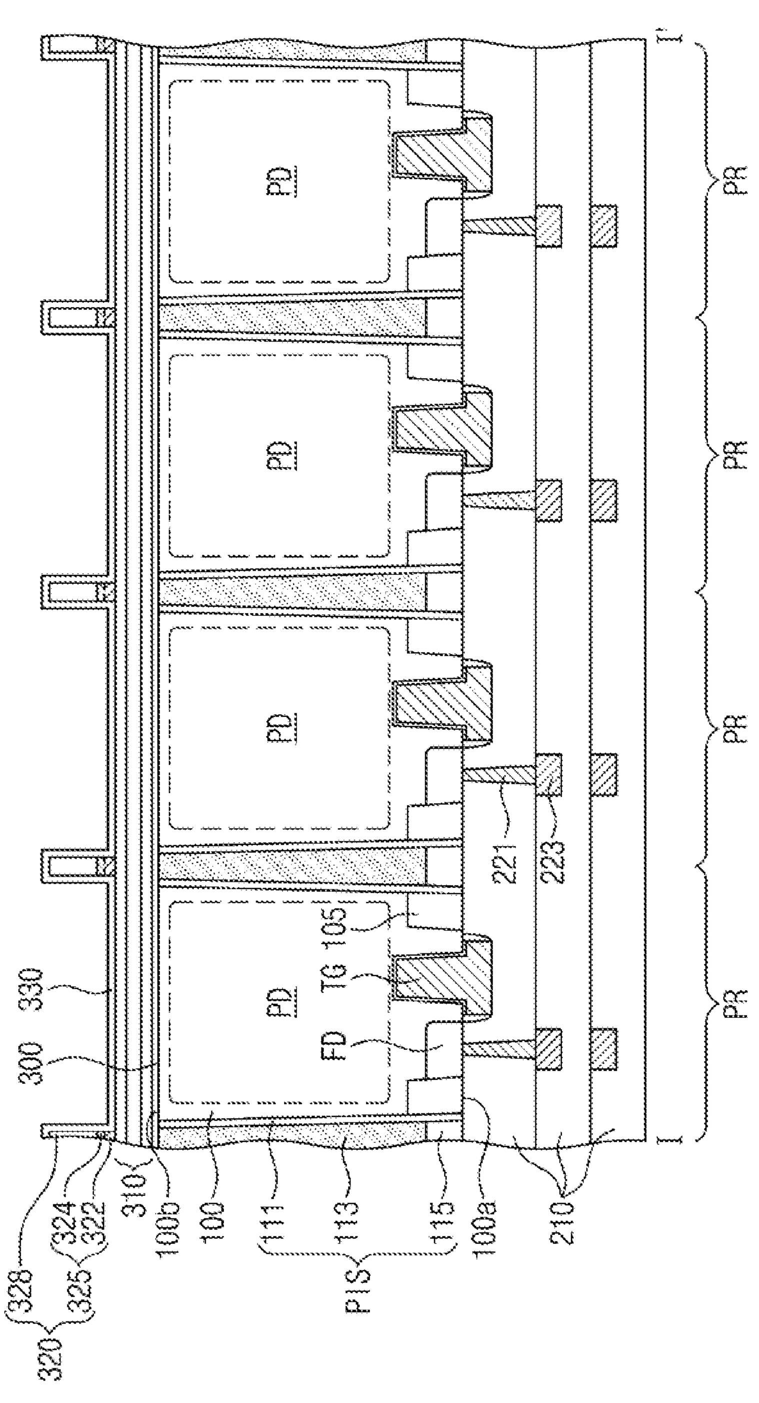

A mask pattern may be formed on the low-refractive layer 327, and the mask pattern may be used to pattern the low-refractive layer 327, the metal oxide layer 323, and the metal layer 321. Therefore, according to one or more example embodiments as shown in FIG. 16, a fence structure 320 may be formed on the antireflection layer 310. When viewed in plan view, as discussed above, the fence structure 320 may overlap the pixel isolation structure PIS in the semiconductor substrate 100.

Referring to one or more example embodiments shown in FIG. 16, a protection layer 330 may be formed to conformally cover a surface of the fence structure 320 and a top surface of the antireflection layer 310 exposed by the fence structure 320. The protection layer 330 may be formed by performing a chemical vapor deposition process or an atomic layer deposition process. The protection layer 330 may comprise a single layer or multiple layers including at least one selected from an aluminum oxide layer and a silicon oxycarbide layer.

Figure 17:
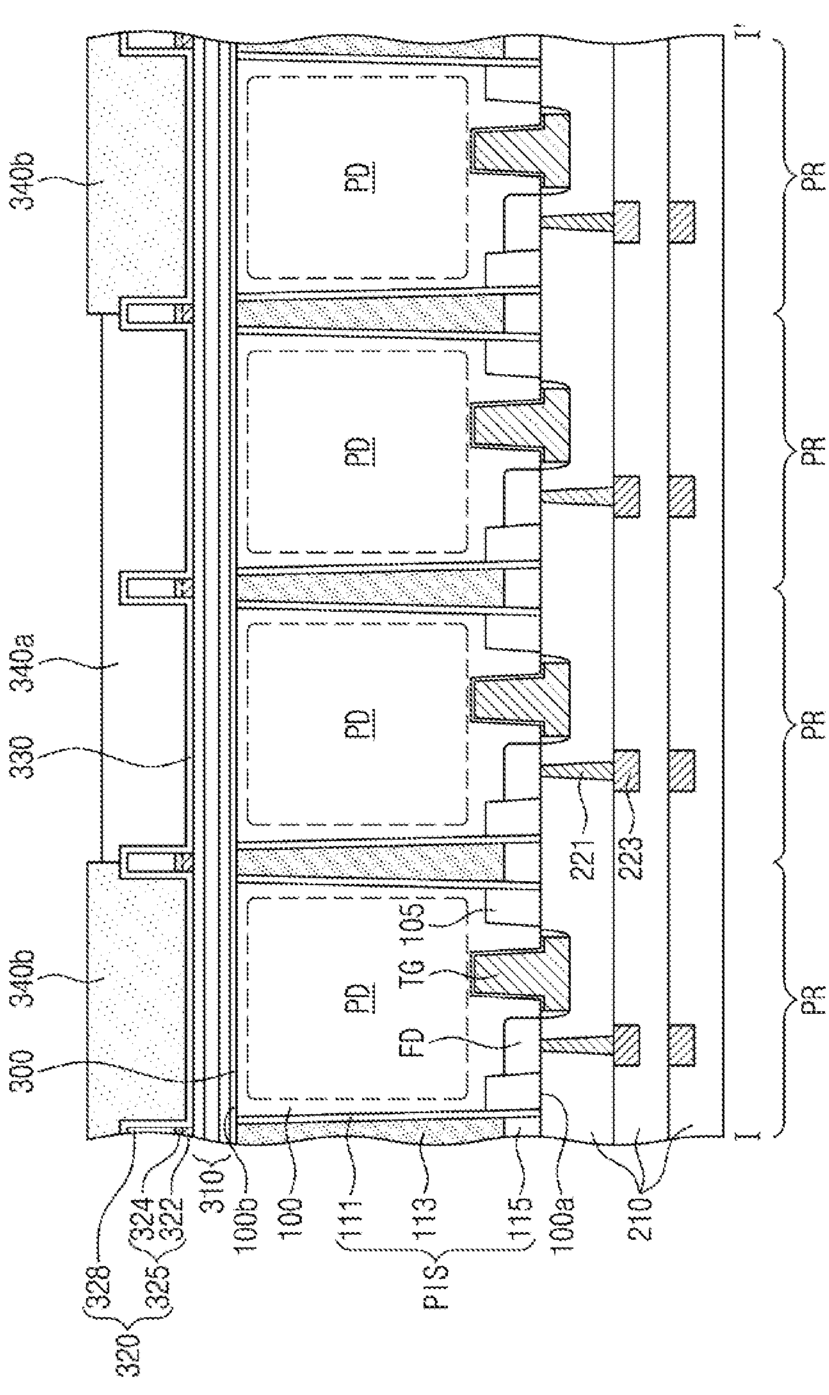

Referring to one or more example embodiments shown in FIGS. 3 and 17, color filters 340*a* and 340*b* may be sequentially formed on corresponding pixel regions PR. The color filters 340*a* and 340*b* may fill empty spaces defined by the fence structure 320.

The color filters 340*a* and 340*b* may be formed by a spin coating process and a patterning process that are repeatedly performed several times. For example, the color filters 340*a* and 340*b* may be formed by a coating process, a soft bake process, an exposure process, and a development process that are sequentially performed on a photoresist composition including a dye or pigment. For example, first color filters 340*a* may be correspondingly formed on first pixel regions, and then second color filters 340*b* may be correspondingly formed on second pixel regions. In addition, after the second color filters 340*b* are formed, third color filters may be correspondingly formed on third pixel regions.

As shown in FIG. 4, microlenses 350 may be formed to correspond to the pixel regions PR.

The microlenses 350 may be formed by forming an optical transmissive photoresist layer, partially patterning the photoresist layer to form photoresist patterns that correspond to the pixel regions PR, and reflowing the photoresist patterns. Thus, the microlenses 350 may be formed which have an upward convex shape having a constant curvature. Further, after the formation of the microlenses 350, a planar part may be formed to have a uniform thickness below the microlenses 350. The microlenses 350 may have a substantially constant curvature on top surfaces of the color filters 340*a* and 340*b*.

A passivation layer 360 may be formed to conformally cover surfaces of the microlenses 350. The passivation layer 360 may comprise, for example, inorganic oxide.

Figure 18:
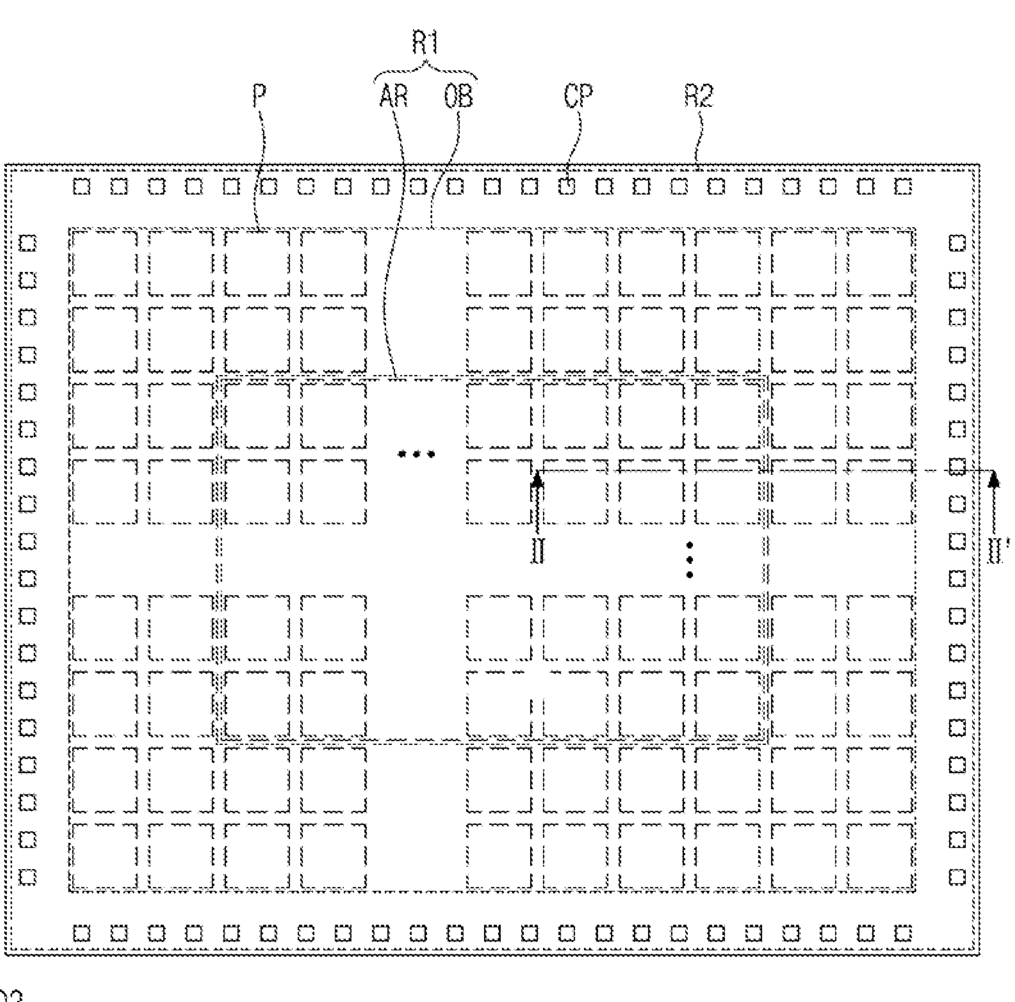
FIG. 18 illustrates a simplified plan view showing an image sensor including a semiconductor device according to one or more example embodiments.
Figure 18:
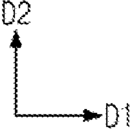
Figure 19:
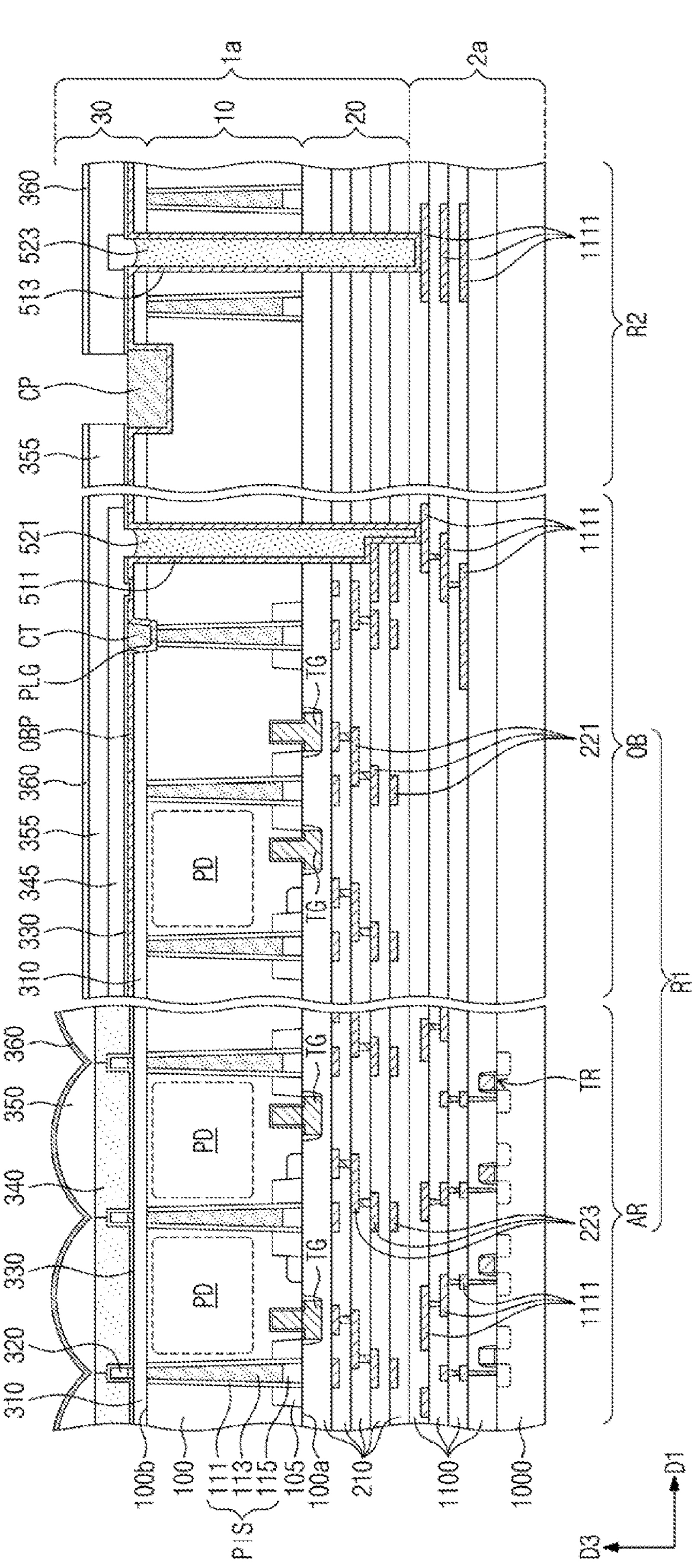
FIGS. 19 and 20 illustrate cross-sectional view taken along line II-II' of FIG. 18, showing an image sensor according to one or more example embodiments.
Figure 20:
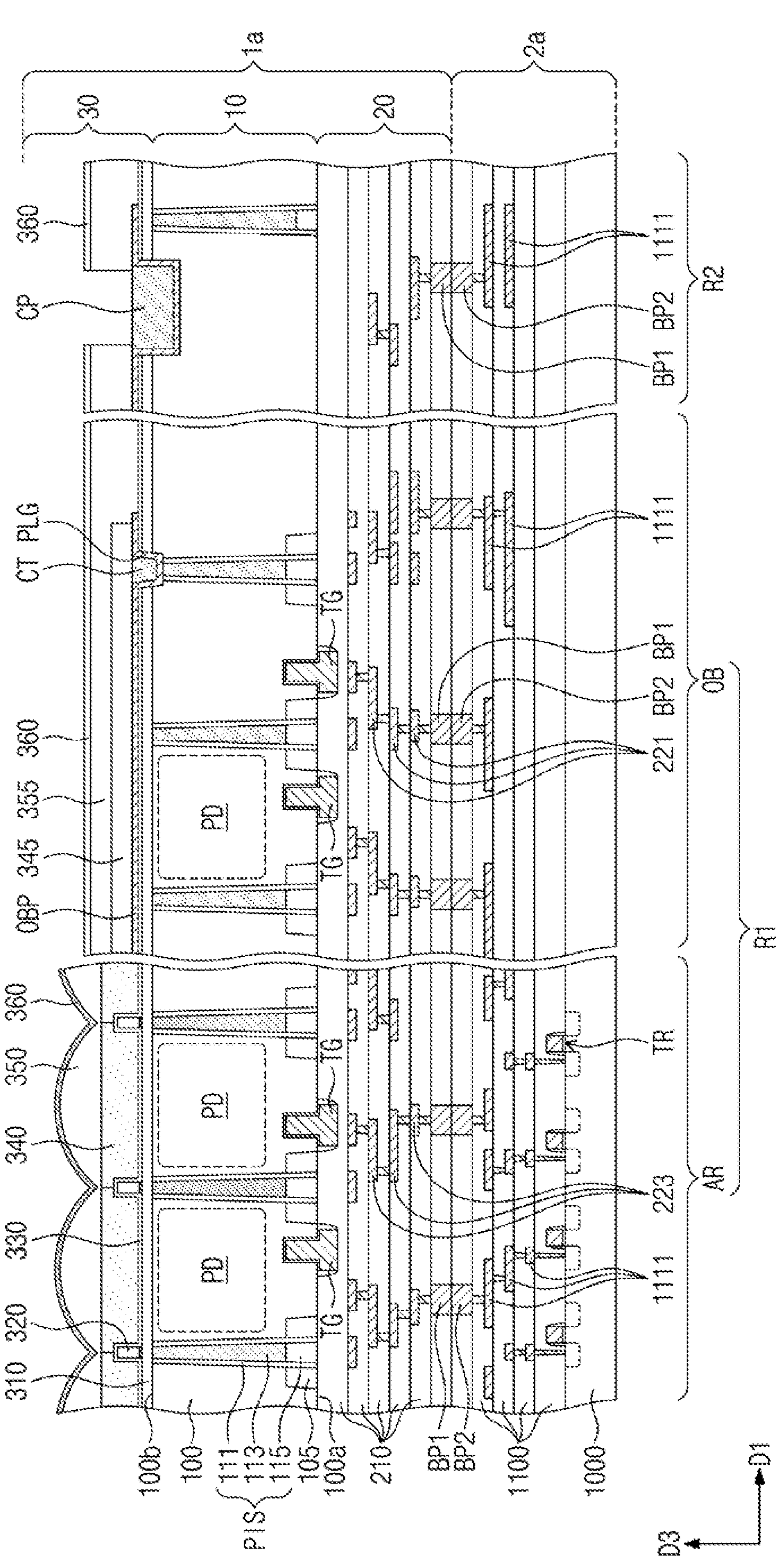

FIG. 18 illustrates a simplified plan view showing an image sensor including a semiconductor device according to one or more example embodiments. FIGS. 19 and 20 illustrate cross-sectional view taken along line II-II' of FIG. 18, showing an image sensor according to one or more example embodiments.

Referring to one or more example embodiments shown in FIGS. 18 and 19, the image sensor may include a sensor chip 1*a* and a logic chip 2*a*. The sensor chip 1*a* may include a pixel array region R1 and a pad region R2.

The pixel array region R1 may include a plurality of unit pixels P that are two-dimensionally arranged along a first direction D1 and a second direction D2 that intersect each other. Each of the unit pixels P may include a photoelectric conversion element and readout elements. Each unit pixel P of the pixel array region R1 may output electrical signals converted from incident light.

The pixel array region R1 may include a light-receiving area AR and a light-shielding area OB. When viewed in plan view, a light-shielding area OB may surround the light-receiving area AR. For example, when viewed in plan view, the light-shielding area OB may be disposed on upside, downside, left-side, and right-side of the light-receiving area AR. The light-shielding area OB may include reference pixels on which no or little light is incident, and an amount of charges sensed in the unit pixels P of the light-receiving area AR may be compared with a reference amount of charges generated from the reference pixels, which may result in obtaining magnitudes of electrical signals sensed in the unit pixels P.

The pad region R2 may include a plurality of conductive pads CP used for input and output of control signals and photoelectric conversion signals. For easy connection with external devices, when viewed in plan view, the pad region R2 may surround the pixel array region R1. The conductive pads CP may transfer electrical signals between the unit pixels P and an external device.

On the light-receiving area AR, the sensor chip 1*a* may have technical characteristics the same as, or similar to, those of the image sensor discussed above according to one or more example embodiments. When viewed in a vertical direction, as discussed above, the sensor chip 1*a* may include a photoelectric conversion layer 10 between a readout circuit layer 20 and an optical transmission layer 30. As discussed above, the photoelectric conversion layer 10 of the sensor chip 1*a* may include a semiconductor substrate 100, a pixel isolation structure PIS that defines pixel regions, and photoelectric conversion regions PD provided in the pixel regions. The pixel isolation structure PIS may have substantially the same structure on the light-receiving area AR and the light-shielding area OB.

On the light-shielding area OB, the optical transmission layer 30 may include a light-shielding pattern OBP, a backside contact plug PLG, a contact pattern CT, an organic layer 355, and a passivation layer 360. On the light-shielding area OB, a portion of the pixel isolation structure PIS may be connected to the backside contact plug PLG.

For example, on the light-shielding area OB, the semiconductor pattern 113 may be connected to the backside contact plug PLG. The backside contact plug PLG may have a width greater than that of the pixel isolation structure PIS. The backside contact plug PLG may include metal and/or metal nitride. For example, the backside contact plug PLG may include titanium and/or titanium nitride.

The contact pattern CT may be buried in a contact hole in which the backside contact plug PLG is formed. The contact pattern CT may include a different material from that of the backside contact plug PLG. For example, the contact pattern CT may include aluminum (Al).

The contact pattern CT and the backside contact plug PLG may be electrically connected to the semiconductor pattern 113 of the pixel isolation structure PIS. A negative bias may be applied thorough the contact pattern CT to the semiconductor pattern 113 of the pixel isolation structure PIS, and the negative bias may be transmitted from the light-shielding area OB to the light-receiving area AR. Therefore, it may be possible to reduce a dark current occurring at a boundary between the pixel isolation structure PIS and the semiconductor substrate 100.

On the light-shielding area OB, the light-shielding pattern OBP may continuously extend from the backside contact plug PLG to rest on a top surface of the antireflection layer 310.

According to one or more example embodiments, the light-shielding pattern OBP may include the same material as that of the barrier pattern (see 325 of FIG. 5A) on the light-receiving area AR. The light-shielding pattern OBP may include a metal pattern and a metal oxide pattern. For example, the light-shielding pattern OBP may include titanium nitride and titanium oxynitride. The light-shielding pattern OBP may not extend to the light-receiving area AR of the pixel array region R1.

The light-shielding pattern OBP may not allow light to travel toward photoelectric conversion regions PD provided on the light-shielding area OB. On reference pixel regions of the light-shielding area OB, the photoelectric conversion regions PD may output noise signals without outputting photoelectric signals. The noise signals may be generated from electrons produced due to heat or dark current.

A protection layer 330 may extend from the pixel array region R1 toward the pad region R2. The protection layer 330 may cover a top surface of the light-shielding pattern OBP.

A filtering layer 345 may cover the protection layer 330 on the light-shielding area OB. The filtering layer 345 may block light whose wavelength is different from that of light produced from the color filters 340. For example, the filtering layer 345 may block an infrared ray. The filtering layer 345 may include a blue color filter, but one or more example embodiments are not limited thereto.

An organic layer 355 and a passivation layer 360 may be provided on the protection layer 330 on the light-shielding area OB and the pad region R2. The organic layer 355 may include the same material as that of the microlenses 350.

On the light-shielding area OB, a first through conductive pattern 511 may penetrate the semiconductor substrate 100 to come into electrical connection with a metal line 223 of the readout circuit layer 20 and with a wiring structure 1111 of the logic chip 2*a*. The first through conductive pattern 511 may have a first bottom surface and a second bottom surface that are located at different levels. A first buried pattern 521 may be provided in the first through conductive pattern 511.

The first buried pattern 521 may include a low-refractive material and may have dielectric properties.

On the pad region R2, conductive pads CP may be provided on the second surface 100*b* of the semiconductor substrate 100. The conductive pads CP may be buried in the second surface 100*b* of the semiconductor substrate 100. For example, on the pad region R2, the conductive pads CP may be provided in a pad trench formed on the second surface 100*b* of the semiconductor substrate 100. The conductive pads CP may include metal, such as aluminum, copper, tungsten, titanium, tantalum, or any alloy thereof. A plurality of bonding wires may be bonded to the conductive pads CP in a mounting process of the image sensor. The conductive pads CP may be electrically connected through the bonding wires to an external device.

On the pad region R2, a second through conductive pattern 513 may penetrate the semiconductor substrate 100 to come into electrical connection with the wiring structure 1111 of the logic chip 2*a*. The second through conductive pattern 513 may extend onto the second surface 100*b* of the semiconductor substrate 100 to come into electrical connection with the conductive pads CP. A portion of the second through conductive pattern 513 may cover bottom surfaces and sidewalls of the conductive pads CP. A second buried pattern 523 may be provided in the second through conductive pattern 513. The second buried pattern 523 may include a low-refractive material and may have dielectric properties. On the pad region R2, the pixel isolation structures PIS may be provided around the second through conductive pattern 513.

The logic chip 2*a* may include a logic semiconductor substrate 1000, logic circuits TR, wiring structures 1111 connected to the logic circuits TR, and logic interlayer dielectric layers 1100. An uppermost one of the logic interlayer dielectric layers 1100 may be coupled to the readout circuit layer 20 of the sensor chip 1*a*. The logic chip 2*a* may be electrically connected to the sensor chip 1*a* via the first through conductive pattern 511 and the second through conductive pattern 513.

In one or more example embodiments, it is explained that the sensor chip 1*a* and the logic chip 2*a* are electrically connected to each other through the first and second through conductive patterns 511 and 513, but one or more example embodiments are not limited thereto.

According to one or more example embodiments shown in FIG. 20, the first through conductive pattern 511 and the second through conductive pattern 513 shown in FIG. 19 may be omitted, and the sensor chip 1*a* and the logic chip 2*a* may be electrically connected to each other through direct contact between bonding pads that are provided at uppermost metal layers of the sensor chip 1*a* and the logic chip 2*a*.

For example, an image sensor may be configured such that the sensor chip 1*a* may include first bonding pads BP1 provided at an uppermost metal layer of the readout circuit layer 20, and that the logic chip 2*a* may include second bonding pads BP2 provided at an uppermost metal layer of the wiring structure 1111. The first and second bonding pads BP1 and BP2 may include, for example, at least one selected from tungsten (W), aluminum (Al), copper (Cu), tungsten nitride (WN), tantalum nitride (TaN), and titanium nitride (TiN).

A hybrid bonding manner may be employed to directly and electrically connect the first bonding pads BP1 of the sensor chip 1*a* to the second bonding pads BP2 of the logic chip 2*a*. In this description, according to one or more example embodiments, the term "hybrid bonding" may denote that two components of the same kind are merged at an interface therebetween. For example, when the first and second bonding pads BP1 and BP2 are formed of copper, a copper-to-copper bonding may be employed to physically and electrically connect the first and second bonding pads BP1 and BP2 to each other. In addition, a dielectric-to-dielectric bonding may be adopted to couple a surface of a dielectric layer included in the sensor chip 1*a* to a surface of a dielectric layer included in the logic chip 2*a*.

According to one or more example embodiments, a thickness of a metal pattern included in a fence structure may be minimized to reduce or minimize a reduction in sensitivity caused by the metal pattern.

While one or more example embodiments have been particularly shown and described above, it will be apparent to those skilled in the art that various changes, substitutions and modifications in form and details may be made therein without departing from the spirit and scope of the following claims.

What is claimed is:

1. An image sensor comprising:

a semiconductor substrate comprising pixel regions; and a fence structure including openings corresponding to the pixel regions, wherein the fence structure comprises:

a metal pattern on the semiconductor substrate;

a low-refractive pattern on the metal pattern; and a metal oxide pattern between the metal pattern and the low-refractive pattern, and wherein the metal pattern and the metal oxide pattern comprise a same metallic material.

2. The image sensor of claim 1, wherein the metallic material comprises at least one selected from Ti, Ta, W, Al, Cu, and In.

3. The image sensor of claim 1, wherein the metal oxide pattern further comprises nitrogen (N).

4. The image sensor of claim 1, wherein a thickness of the metal oxide pattern is less than a thickness of the metal pattern.

5. The image sensor of claim 1, wherein a sum of a thickness of the metal pattern and a thickness of the metal oxide pattern is in a range from about 40 Å to about 100 Å.

6. The image sensor of claim 1, wherein the metal pattern comprises at least one selected from TiN, TaN, Ti, Ta, Al, W, Cu, and ITO.

7. The image sensor of claim 1, wherein the metal oxide pattern comprises at least one selected from TiOx, TiON, and ITO.

8. The image sensor of claim 1, wherein the metal pattern has a thickness from about 30 Å to about 60 Å.

9. The image sensor of claim 1, wherein the metal oxide pattern has a thickness from about 30 Å to about 60 Å.

10. The image sensor of claim 1, further comprising:

color filters in corresponding openings of the fence structure; and a protection layer on sidewalls of the fence structure and on bottom surfaces of the color filters.

11. The image sensor of claim 1, further comprising:

a photoelectric conversion region in the semiconductor substrate on the pixel regions; and a pixel isolation structure in the semiconductor substrate disposed around the pixel regions, wherein the fence structure overlaps the pixel isolation structure.

12. An image sensor comprising:

a semiconductor substrate comprising pixel regions; and a fence structure including openings that correspond to the pixel regions, wherein the fence structure comprises:

a barrier pattern on the semiconductor substrate; and a low-refractive pattern on the barrier pattern, wherein the barrier pattern comprises metal and oxygen, wherein the barrier pattern comprises:

a lower portion adjacent to the semiconductor substrate; and an upper portion adjacent to the low-refractive pattern, wherein an oxygen concentration of the upper portion of the barrier pattern is greater than an oxygen concentration of the lower portion of the barrier pattern, and wherein the upper portion of the barrier pattern and the lower portion of the barrier pattern comprise a same metallic material.

13. The image sensor of claim 12, wherein a transmittance in the upper portion of the barrier pattern is greater than a transmittance in the lower portion of the barrier pattern.

14. The image sensor of claim 12, wherein the lower portion of the barrier pattern is oxygen free.

15. The image sensor of claim 12, wherein the barrier pattern further comprises nitrogen (N).

16. The image sensor of claim 12, wherein the metal in the barrier pattern comprises at least one selected from Ti, Ta, W, Al, Cu, and In.

17. The image sensor of claim 12, wherein the barrier pattern has a thickness from about 40 Å to about 100 Å.

18. An image sensor comprising:

a semiconductor substrate comprising:

a first surface;

a second surface opposite to the first surface;

a light-receiving area; and a light-shielding area;

a pixel isolation structure in the semiconductor substrate on the light-receiving area and the light-shielding area, the pixel isolation structure being disposed around a plurality of pixel regions;

a plurality of photoelectric conversion regions in the semiconductor substrate of the plurality of pixel regions on the light-receiving area and the light-shielding area;

a plurality of microlenses on the second surface of the semiconductor substrate, each of the plurality of microlenses being on a corresponding one of the plurality of pixel regions;

a plurality of color filters between the plurality of microlenses and the second surface of the semiconductor substrate, each of the plurality of color filters being on a corresponding one of the plurality of pixel regions;

an antireflection layer between the plurality of color filters and the second surface of the semiconductor substrate; and a fence structure on the antireflection layer and between neighboring ones of the plurality of color filters, wherein the fence structure comprises:

a barrier pattern on the antireflection layer; and a low-refractive pattern on the barrier pattern, and wherein the barrier pattern comprises:

a metal pattern on the antireflection layer; and a metal oxide pattern between the metal pattern and the low-refractive pattern, the metal oxide pattern comprising nitrogen (N).

19. The image sensor of claim 18, further comprising a light-shielding pattern on the antireflection layer on the light-shielding area, wherein the light-shielding pattern overlaps a photoelectric conversion region of the plurality of photoelectric conversion regions on the light-shielding area, and wherein the light-shielding pattern and the barrier pattern comprise a same material.

20. The image sensor of claim 19, wherein the barrier pattern and the light-shielding pattern comprise metal and oxygen, wherein the barrier pattern comprises:

a lower portion adjacent to the semiconductor substrate; and an upper portion adjacent to the low-refractive pattern, and wherein an oxygen concentration of the upper portion of the barrier pattern is greater than an oxygen concentration of the lower portion of the barrier pattern.

* * * * *